United States Patent [19] [11] Patent Number: 5,698,896
Komatsu et al. [45] Date of Patent: *Dec. 16, 1997

[54] HIGH THERMAL CONDUCTIVE SILICON NITRIDE STRUCTURAL MEMBER, SEMICONDUCTOR PACKAGE, HEATER AND THERMAL HEAD

[75] Inventors: Michiyasu Komatsu; Yoshitoshi Sato, both of Yokohama; Katsuhiro Shinosawa, Kawasaki; Mineyuki Yamaga, Yomohama, all of Japan

[73] Assignee: Kabushiki Kaisha Toshiba, Kawasaki, Japan

[*] Notice: The term of this patent shall not extend beyond the expiration date of Pat. No. 5,439,856.

[21] Appl. No.: 364,195

[22] Filed: Dec. 27, 1994

[30] Foreign Application Priority Data

Dec. 27, 1993 [JP] Japan .................. 5-333595
Dec. 27, 1993 [JP] Japan .................. 5-333596

[51] Int. Cl.⁶ .............. H01L 23/06; H01L 23/12; C04B 35/58; H05B 1/00
[52] U.S. Cl. .............. 257/705; 257/703; 257/712; 501/97; 219/200
[58] Field of Search .............. 257/705, 712, 257/703

[56] References Cited

U.S. PATENT DOCUMENTS

| 3,874,915 | 4/1975 | Ono et al. ........... 117/212 |
| 4,617,575 | 10/1986 | Fuyama et al. ....... 346/76 |
| 4,634,300 | 1/1987 | Takebayashi et al. .. 384/548 |
| 4,806,510 | 2/1989 | Kanai et al. .......... 501/97 |
| 4,845,339 | 7/1989 | Kato ................... 219/216 |
| 4,849,605 | 7/1989 | Nakamori et al. ..... 219/216 |
| 5,233,166 | 8/1993 | Maeda et al. ......... 219/552 |
| 5,294,750 | 3/1994 | Sakai et al. .......... 257/678 |
| 5,439,856 | 8/1995 | Komatsu ............... 501/97 |

FOREIGN PATENT DOCUMENTS

| 0 438 897 | 7/1991 | European Pat. Off. . |
| 0 587 119 | 3/1994 | European Pat. Off. . |
| 42 03 183 | 8/1992 | Germany . |
| 4-175268 | 6/1992 | Japan . |

Primary Examiner—Mahshid D. Saadat
Assistant Examiner—Jhihan B. Clark
Attorney, Agent, or Firm—Foley & Lardner

[57] ABSTRACT

A high thermal conductive silicon nitride structural member of the present invention contains a rare earth element in the range of 1.0 to 7.5 wt. % calculated as oxide thereof and Li, Na, K, Fe, Ca, Mg, Sr, Ba, Mn and B as impurity cationic elements in a total amount not greater than 0.3 wt. %, and has the thermal conductivity not less than 60 W/(m.K), preferably not less than 80 W/(m.K). Also, a high thermal conductive silicon nitride sintered body consists of silicon nitride particles and a grain boundary phase, a crystal compound phase in the grain boundary phase being not less than 20 vol. %, preferably not less than 50 vol. %, with respect to the entire grain boundary phase, and has the thermal conductivity not less than 60 W/(m.K), preferably not less than 80 W/(m.K). A semiconductor package of the present invention comprising a ceramic substrate on which a semiconductor chip is mounted, lead frames joined to the same surface of the ceramic substrate as on which the semiconductor chip is mounted, and bonding wires for electrically connecting the semiconductor chip and the lead frames, wherein the ceramic substrate is formed of the above high thermal conductive silicon nitride sintered body.

25 Claims, 10 Drawing Sheets

HIGH THERMAL CONDUCTIVE SILICON NITRIDE STRUCTURAL MEMBER, SEMICONDUCTOR PACKAGE, HEATER AND THERMAL HEAD

TECHNICAL BACKGROUND OF THE INVENTION

1. Field of the Invention

The present invention relates to a high thermal conductive silicon nitride structural member and application parts using high thermal conductive silicon nitride, such as a semiconductor package, a heater and a thermal head. More particularly, the semiconductor package is superior in mechanical structural strength and heat releasing. The heater includes a heating resistor disposed on the surface of or within a sintered body of high thermal conductive silicon nitride, and is superior particularly in mechanical strength and thermal response for ON-OFF control of a voltage applied to the heating resistor. The thermal head is superior in high-speed printing with fine accuracy.

2. Description of the Related Art

Because a ceramic sintered body containing silicon nitride as a primary component is generally highly resistant against heat even under environment at high temperature over 1000° C. and also highly resistant against thermal shocks, its application as a high-temperature structural part material instead of a conventional heat-resistant super alloy to various high-strength and heat-resistant parts, such as gas turbine parts, engine parts and mechanical parts for steel manufacture, has been attempted. Also, such a ceramic sintered body has good corrosion resistance against metals and, therefore, its application as a melt-resistant material for molten metals has been tried. Further, such a ceramic sintered body has good wear resistance and, therefore, its application to sliding members, such as bearings, and cutting tools has been practiced.

For composition of the ceramic sintered body of silicon nitride, it is conventionally known to add, as a sintering assistant agent, at least one oxide of rare-earth elements or alkaline rare-earth elements, such as yttrium oxide ($Y_2O_3$), cerium oxide (CeO) and calcium oxide (CaO), to silicon nitride. The sintering assistant agent serves to enhance a sintering process so as to increase a degree of compactness (density) and strength.

The conventional sintered body of silicon nitride is manufactured by adding the above sintering assistant agent to silicon nitride powder to prepare a material mixture, pressing the mixture into a compact, baking the pressed compact in a baking furnace for a predetermined period of time at temperature in the range of 1600° to 1850° C., cooling the baked compact by stopping power supplied to the furnace, and machining the resultant sintered body into a product by cutting and grinding.

The sintered body of silicon nitride manufactured by the above conventional method is superior in mechanical strength represented by deflective strength, rupture toughness, etc., and also has the small coefficient of thermal expansion. However, its thermal conductivity is as low as 20 to 30 W/(m.K) and its heat releasing is remarkably inferior to other sintered bodies of aluminum nitride (AlN), beryllium oxide (BeO), silicon carbide (SiC), etc. It has therefore been difficult to employ the conventional sintered body of silicon nitride as electronic materials of, e.g., substrates for semiconductor packages, and as substrates for heaters, which particularly require a high ability of heat releasing.

On the other hand, because the sintered body of aluminum nitride has the higher thermal conductivity and the lower coefficient of thermal expansion than other kinds of sintered bodies, its use has become more prevalent as a material for circuit board parts, substrates and enclosures of semiconductor packages, etc. which are more and more increasing in speed, output power, function, as well as size. However, the sintered body of aluminum nitride which is sufficiently satisfactory in mechanical strength has not been obtained so far. Its stability (e.g., oxidation resistance) at high temperature is also not sufficient.

For example, a semiconductor package using a substrate formed of the sintered body of aluminum nitride is apt to break due to the thermal stress caused upon heating under energization or deficiency in the substrate strength when it is fixed to a mount board. Accordingly, semiconductor packages are also required to have not only a satisfactory characteristic of mechanical strength enough to endure thermal stresses, shocks, etc., but also a superior characteristic of heat releasing enough to be adaptable for higher output power and an increased amount of heat generated.

A thermal heater is fabricated by forming a linear heating resistor, which has any desired width and length, on a ceramic substrate by pattern printing, or installing the resistor within the substrate, and it is widely utilized as parts of glow plugs for diesel engines, thermal heads and so forth.

Further, a thermal head comprising a heater formed of a heating resistor, electric leads and a wear-resistant layer, these members being all formed on a ceramic substrate, is employed in a variety of printing equipment. In heat-sensitive recording devices such as measurement recorders, printers and facsimile machines, for example, various thermal heads are used to convert information sent to those devices in the form of electric signals into an image of letters, symbols or figures on heat-sensitive recording paper. The thermal head has a heating resistor to heat chemical materials which are coated on the heat-sensitive recording paper and develop a color upon heating, enabling characters and/or images to be thermally formed on the paper.

More specifically, a thermal head for use as a recording unit of conventional thick-film type thermal printers generally has a basic construction as shown in FIG. 21. The thermal head comprises a ceramic substrate 101 made of alumina ($Al_2O_3$), a heating resistor 102 formed on the substrate 101 for generating heat upon application of a voltage, electric leads 103 connected to respective ends of the heating resistor 102 in opposite relation, and a wear-resistant layer 105 for protecting the heating resistor 102 and the electric leads 103 against their wears caused by contact with heat-sensitive recording paper 104.

The heat-sensitive recording paper 104 is brought into pressure contact with the above thick-film type thermal head through a feed roller 106. When a pulse voltage is applied to the heating resistor 102 in that condition, a color former coated on the heat-sensitive recording paper 104 causes the chemical reaction so that a color developing layer of the recording paper in contact with the heating resistor 102 develops a color in the form of dots. By repeating the heating with the pulse voltage while the heat-sensitive recording paper 104 is moved successively in the direction of arrows, a number of dots develop a color correspondingly to record an image of letters, symbols or figures depending on an array of the color-developed dots.

However, the ceramic substrate for use in the conventional heater is made of alumina ($Al_2O_3$), as a primary constituent material, which has the small thermal conductivity, and hence accompanies a problem of poor thermal response. Specifically, the heater takes a long delay time for its surface temperature to reach a predetermined value upon ON-OFF switching of power supply to the heating resistor, and has a difficulty in achieving quick response.

Since the ceramic substrate for use in the conventional thermal head is also made of alumina ($Al_2O_3$), as a primary constituent material, which has the small thermal conductivity, its thermal response is poor and a long heat releasing time is required for the head to be cooled down, after once heated, to a temperature less than the color developing temperature of the heat-sensitive paper. As a result, a background smear of the recording paper and trailing of printed dots become more likely to occur. This means that such a ceramic substrate is mostly unsuitable for heads of high-speed recording printers. To satisfy a recent demand on speeding up the printing, there is desired a thermal head which is sufficiently adaptable for speed-up of the printing and can provide quick thermal response and high reliability.

On the other hand, because of having the higher thermal conductivity and the lower coefficient of thermal expansion than other ceramic substrates, the substrate of aluminum nitride has become more prevalent in its use with circuit parts and packages for semiconductor chips which are more and more increasing in speed, output power, function, as well as size. However, the substrate of aluminum nitride which sufficiently satisfies the mechanical strength represented by deflective strength, rupture toughness, etc. required for heaters and thermal heads, has not been obtained so far. In other words, such a substrate has a problem of possibly breaking due to the thermal stress caused upon heating. Additionally, its characteristics are not so stable in point of tending to react with oxygen and moisture at high temperature.

Furthermore, when heaters and thermal heads using the above ceramic substrates are fixed to mount members by, e.g., fastening screws, those heaters and thermal heads may be broken due to a slight deformation caused by pressing forces applied to fasten the screws, or impact forces produced during the printing operation, resulting in a remarkable reduction in yield of the applied products. Therefore, the heaters and the thermal heads which have not only a satisfactory characteristic of mechanical strength enough to endure external forces, but also a superior characteristic of thermal response enough to be adaptable for increased output power and speed-up. Such a higher degree of function is required particularly in thermal heads for use with heat-sensitive recording devices to achieve printing at a higher speed and a finer accuracy.

Thus, development of a ceramic sintered body having the superior mechanical strength and the high thermal conductivity is demanded in a variety of fields.

SUMMARY OF THE INVENTION

The present invention has been made to deal with the above-described demand in the art, and its first object is to provide a silicon nitride structural member and an application part using high thermal conductive silicon nitride, such as a semiconductor package, which has the high thermal conductivity and is superior in heat releasing, in addition to a characteristic of high mechanical strength which is intrinsically given to a sintered body of silicon nitride.

A second object of the present invention is to provide a heater which has the high thermal conductivity and is superior in thermal response, in addition to a characteristic of high mechanical strength, and a thermal head which also has characteristics of high mechanical strength and superior thermal response so that recording by printing is enabled at a higher speed.

To achieve the above objects, with an attention focused on a sintered body of silicon nitride which has the extremely high mechanical strength represented by deflective strength, rupture toughness, etc., the inventors have studied various methods of increasing the thermal conductivity of the sintered body of silicon nitride without impairing the inherent mechanical strength, and have researched its applicability to substrate materials for semiconductor packages, heaters and thermal heads. Stated otherwise, as a result of studying various kinds of silicon nitride powder, various kinds and amounts of sintering assistant agents and additives, various sintering conditions, etc. starting from the conventional sintered body of silicon nitride, the inventors have succeeded in developing a sintered body of silicon nitride having the thermal conductivity twice or more as high as that of the conventional one, i.e., not less than 60 W/(m.K), preferably not less than 80 W/(m.K), and have confirmed that the novel sintered body of silicon nitride is highly effective in application to not only final products such as high-temperature structural parts, but also substrates for semiconductor packages, heaters and thermal heads.

More specifically, the inventors found that a sintered body of silicon nitride which had the thermal conductivity twice or more as high as that of the conventional one, i.e., not less than 60 W/(m.K), preferably not less than 80 W/(m.K) and also had the high mechanical strength could be obtained by adding predetermined amounts of a rare earth element and an aluminum component such as alumina to fine and high-purity silicon nitride powder to prepare a material mixture, pressing and degreasing the mixture into a compact, heating and holding the pressed compact at predetermined temperature for a certain time to thereby sinter it into a more compacted state, cooling the sintered compact gradually at a rate not greater than a predetermined value, and machining the resultant sintered body into a product by cutting and grinding, and developed a novel sintered body of silicon nitride which was sufficiently satisfactory in both characteristics of heat releasing and mechanical strength. It was also found that the novel sintered body of silicon nitride could achieve superior characteristics of heat releasing, thermal response and durability when applied to structural members such as sliding members of compressors and high-temperature corrosion-resistant members of gas turbines, substrates and enclosures of semiconductor packages, as well as other parts such as heaters and thermal heads.

Further, it was found that by using, as a constituent material of the novel sintered body of silicon nitride, high-purity silicon nitride powder having reduced contents of oxygen and impurity cationic elements, and sintering it under predetermined conditions, it was possible to effectively suppress generation of a glass phase (amorphous phase) in the grain boundary phase, to create in the grain boundary phase crystal compounds not less than 20 vol. %, preferably not less than 50 vol. %, with respect to the entire grain boundary phase, and to provide a structural member of silicon nitride having the high thermal conductivity not less than 60 W/(m.K), preferably not less than 80 W/(m.K) even when only any oxide of rare earth elements was added to the material powder.

Additionally, in the conventional case where the sintered body was cooled after the end of the sintering operation with a heating power supply for the baking furnace turned off, the cooling rate was as quick as 400° to 800° C. per hour. On the contrary, it was found from experiments made by the inventors that by controlling the cooling rate, in particular, to be slow not higher than 100° C. per hour, the grain boundary phase in the sintered body structure of silicon nitride was promoted to change from the amorphous state into the state containing a crystal phase, enabling both characteristics of high mechanical strength and high thermal conductivity to be achieved at the same time. Especially, it was found that the novel sintered body of silicon nitride could provide superior characteristics of durability and thermal response when used as substrates of heaters and thermal heads.

The present invention has been accomplished based on the above findings. More specifically, a high thermal conductive silicon nitride structural member according to the present invention contains a rare earth element in the range of 1.0 to 7.5 wt. % calculated as oxide thereof and Li, Na, K, Fe, Ca, Mg, Sr, Ba, Mn and B as impurity cationic elements in a total amount of not greater than 0.3 wt. %, and has the thermal conductivity not less than 60 W/(m.K), preferably not less than 80 W/(m.K).

In another form, the high thermal conductive silicon nitride structural member consists of silicon nitride particles and a grain boundary phase, a crystal compound phase in the grain boundary phase being not less than 20 vol. %, preferably not less than 50 vol. %, with respect to the entire grain boundary phase, and has the thermal conductivity not less than 60 W/(m.K), preferably not less than 80 W/(m.K).

When the above high thermal conductive silicon nitride structural member is applied to sliding members such as vanes, rollers, cylinders and bearings of rotary compressors, high-temperature corrosion-resistant members such as cylinders and piston heads of automobile engines, enclosures of transmitting and receiving tubes, inner and outer races and rolling balls of bearings, as well as shaping rolls, there can be obtained structural members which are satisfactory in various characteristics such as wear resistance, light-weight and corrosion resistance, while providing satisfactory characteristics of heat releasing and strength.

Further, a semiconductor package according to the present invention comprises a ceramic substrate on which a semiconductor chip is mounted, lead frames joined to the same surface of the ceramic substrate as on which the semiconductor chip is mounted, and bonding wires for electrically connecting the semiconductor chip and the lead frames, wherein the ceramic substrate is formed of a high thermal conductive silicon nitride sintered body which contains a rare earth element in the range of 1.0 to 7.5 wt. % calculated as oxide thereof and Li, Na, K, Fe, Ca, Mg, Sr, Ba, Mn and B as impurity cationic elements in a total amount of not greater than 0.3 wt. %, and has the thermal conductivity not less than 60 W/(m.K), preferably not less than 80 W/(m.K).

A semiconductor package as another form comprises a ceramic substrate on which a semiconductor chip is mounted, lead frames joined to the same surface of the ceramic substrate as on which the semiconductor chip is mounted, and bonding wires for electrically connecting the semiconductor chip and the lead frames, wherein the ceramic substrate is formed of a high thermal conductive silicon nitride sintered body which consists of silicon nitride particles and a grain boundary phase, a crystal compound phase in the grain boundary phase being not less than 20 vol. %, preferably not less than 50 vol. %, with respect to the entire grain boundary phase, and has the thermal conductivity not less than 60 W/(m.K), preferably not less than 80 W/(m.K).

The high thermal conductive silicon nitride sintered body is manufactured, by way of example, as follows. A material mixture is prepared by adding a rare earth element of 1.0 to 7.5 wt. % calculated as oxide thereof to silicon nitride powder which contains oxygen not greater than 1.7 wt. %, Li, Na, K, Fe, Ca, Mg, Sr, Ba, Mn and B, as impurity cationic elements, not greater than 0.3 wt. % in total and α-phase silicon nitride not less than 90 wt. %, and which has a mean powder size (an average diameter) not greater than 0.8 μm. The material mixture is pressed into a compact by, e.g., the doctor blade method. The resultant pressed compact is sintered, after degreasing, in an atmosphere under pressure at temperature of 1800° to 2000° C. The sintered body is then cooled at a cooling rate not greater than 100° C. per hour from the above sintering temperature to the temperature at which the liquid phase formed by the rare earth element during the sintering is solidified. The cooled sintered body is machined into a product by cutting and grinding.

In the above manufacture method, the material mixture may be added with at least one selected from the group consisting of oxides, carbides, nitrides, silicides and borides of Ti, Zr, Hf, V, Nb, Ta, Cr, Mo and W in the range of 0.2 to 3.0 wt. % and, as needed, at least one of alumina and aluminum nitride in the range of 0.1 to 2.0 wt. %

With the above manufacture method, a grain boundary phase containing the rare earth element, etc. is formed in the crystal structure of silicate nitride, and a sintered body of silicon nitride having superior characteristics of mechanical strength and thermal conductivity, i.e., porosity not greater than 1.5%, thermal conductivity not less than 60 W/(m.K), preferably not less than 80 W/(m.K), and three-point bending strength not less than 80 kg/mm$^2$ at room temperature.

As the silicon nitride powder being a primary material of the sintered body of silicon nitride according to the present invention, fine powder of silicon nitride is used which contains oxygen not greater than 1.7 wt. %, preferably in the range of 0.5 to 1.5 wt. %, Li, Na, K, Fe, Ca, Mg, Sr, Ba, Mn and B, as impurity cationic elements, not greater than 0.3 wt. % in total, preferably not greater than 0.2 wt. %, and α-phase silicon nitride being superior in sintering characteristic not less than 90 wt. %, preferably not less than 93 wt. %, and which has a mean powder size not greater than 0.8 μm, preferably in the range of 0.4 to 0.6 μm, taking into account desired characteristics of sintering, mechanical strength and thermal conductivity.

By using the fine material powder with a mean powder size not greater than 0.8 μm, a compact sintered body having the porosity not greater than 1.5% can be formed even with the small amount of a sintering assistant agent. Also, reducing a risk that the sintering assistant agent may impair a desired characteristic of thermal conductivity.

Since Li, Na, K, Fe, Ca, Mg, Sr, Ba, Mn and B serve as impurity cationic elements, i.e., as substances to impair the thermal conductivity, the total content of the impurity cationic elements is set to be not greater than 0.3 wt. % in total for ensuring the thermal conductivity not less than 60 W/(m.K). Particularly, by using the material powder of silicon nitride containing α-phase silicon nitride not less than 90 wt. % which is superior in sintering to β-phase silicon nitride, a high-density structural member can be manufactured.

The material powder of silicon nitride may contain a rare earth element to be added as a sintering assistant agent, which is one or a combination of two or more selected from oxides of Y, La, Sc, Pr, Ce, Nd, Dy, Ho, Gd, etc. or substances turning to those oxides through a sintering process. Among them, yttrium oxide ($Y_2O_3$) is particularly preferable. The sintering assistant agent functions as a sintering accelerator which reacts with the material powder of silicon nitride to produce a liquid phase.

In a case where the sintering assistant agent is $Y_2O_3$, the amount of the sintering assistant agent added is set to be in the range of 1.0 to 7.5 wt. % calculated as oxide thereof with respect to the material powder. If the amount of the sintering assistant agent is too small, i.e., less than 1.0 wt. %, the sintered body would not be sufficiently compacted. On the other hand, if it is too large, i.e., greater than 7.5 wt. %, the grain boundary phase would be produced in an excessive amount, causing a reduction in the thermal conductivity and the mechanical strength. Optimally, the amount of the sintering assistant agent is set to be in the range of 3.0 to 6.0 wt. %.

Further, alumina ($Al_2O_3$) as another additive component serves to promote the function of the rare earth element as a sintering assistant agent, and is notably effective particularly during the sintering process under pressure. If the amount of $Al_2O_3$ added is less than 0.1 wt. %, the sintered body would not be sufficiently compacted. On the other hand, if it is too large, i.e., greater than 2.0 wt. %, the grain boundary phase would be produced in an excessive amount, or alumina would start turning to a solid solution in the silicon nitride, causing a reduction in the thermal conductivity. Therefore, the amount of $Al_2O_3$ added is set to be not greater than 2.0 wt. %, preferably in the range of 0.1 to 2.0 wt. %. In order to ensure satisfactory characteristics of both the mechanical strength and the thermal conductivity, it is desirable to set the amount of $Al_2O_3$ added to be in the range of 0.2 to 1.5 wt. %.

When alumina is used in combination with aluminum nitride (AlN) described below, the total amount of alumina and AlN is desirably set to be not greater than 2.0 wt. %.

Aluminum nitride (AlN) as another optional additive component serves to not only suppress evaporation of silicon nitride in the sintering process, but also further promote the function of the rare earth element as a sintering assistant agent.

Oxides, carbides, nitrides, silicides and borides of Ti, Zr, Hf, V, Nb, Ta, Cr, Mo and W which are used as other optional additive components serve to promote the function of the rare earth element as a sintering assistant agent, and also to enhance dispersion and strength in the crystal structure, thereby increasing the mechanical strength of the sintered body of $Si_3N_4$. If the amount of those compounds added is less than 0.2 wt. %, the above effects would be not sufficient, but if it is too large, i.e., greater than 3.0 wt. %, the thermal conductivity, the mechanical strength and the dielectric breakdown strength would be reduced. Therefore, the amount of those compounds added is preferably set to be in the range of 0.2 to 3.0 wt. %, more preferably in the range of 0.3 to 2.0 wt. %.

The above compounds of Ti, Zr, Hf, etc. further function as a light-shield agent for making the sintered body of silicon nitride colored and opaque. Therefore, particularly when the sintered body of silicon nitride is used to manufacture substrates and enclosures for circuit boards and semiconductor packages mounting thereon integrated circuits, etc. which are easily susceptible to malfunction with light, it is desirable to add a proper amount of the above compounds so that the sintered body of silicon nitride can sufficiently shield the light.

Aluminum nitride (AlN) serves to suppress evaporation of silicon nitride in the sintering process, to promote the function of the sintering assistant agent, and to relatively reduce the amount of oxides, etc. of Ti, Zr, Hf, V, Nb, Ta, Cr, Mo and W to be added, as with alumina. The amount of the aluminum compounds, such as alumina and aluminum nitride, added is closely related to the amount of oxides, etc. of Ti, Zr, Hf, V, Nb, Ta, Cr, Mo and W added. More specifically, if the amount of the Ti compound, etc. added is less than 0.2 wt. % and aluminum compounds such as $Al_2O_3$ and AlN are added solely or jointly in the amount less than 0.1 wt. %, the sintered body would not be sufficiently compacted. On the other hand, if the amount of the aluminum compounds added is too large, i.e., greater than 2.0 wt. %, the grain boundary phase would be produced in an excessive amount, or the aluminum compounds would start turning to a solid solution in the silicon nitride, causing a reduction in the thermal conductivity. Therefore, the amount of the aluminum compounds added is preferably set to be in the range of 0.1 to 2.0 wt. %. In order to ensure satisfactory characteristics of both the mechanical strength and the thermal conductivity, it is desirable to set the amount of the aluminum compounds added to be in the range of 0.2 to 1.5 wt. %.

The porosity of the sintered body remarkably affects the thermal conductivity and the mechanical strength, and it is set to be not greater than 1.5%, preferably not greater than 0.5%. If the porosity exceeds 1.5%, the presence of pores would impair thermal conduction to reduce the thermal conductivity of the sintered body, and also would cause a reduction in the mechanical strength of the sintered body.

Since the grain boundary phase formed in the crystal structure of the sintered body of silicon nitride remarkably affects the thermal conductivity of the sintered body, it is important in the sintered body of silicon nitride according to the present invention that a crystal phase amounts to not less than 20 vol. %, preferably not less than 50 vol. %, in the grain boundary phase. If the crystal phase is less than 20 vol. %, there would not be obtained a sintered body which is superior not only in heat releasing with the thermal conductivity not less than 60 W/(m.K), but also in mechanical strength. Preferably, the crystal phase is to be not less than 50 vol. %.

The above sintered body of silicon nitride in which the porosity is not greater than 1.5% and the crystal phase amounts to not less than 20 vol. %, preferably not less than 50 vol. %, in the grain boundary phase formed in the crystal structure of silicon nitride, can be manufactured by sintering a pressed compact of silicon nitride under pressure at temperature of 1800° to 2000° C. for about 5 to 10 hours, and controlling a cooling rate of the sintered body to be not greater than 100° C. per hour immediately after the sintering process.

If the sintering temperature is set to be less than 1800° C., the structural member would be not sufficiently compacted and the porosity would be not less than 1.5%, whereby the mechanical strength and the thermal conductivity would be both reduced. On the other hand, if the sintering temperature exceeds 2000° C., the silicon nitride component would be in itself more apt to decompose and evaporate. If the compact is sintered at normal pressure rather than under pressure, silicon nitride would start to decompose and evaporate at temperature of about 1800° C. For this reason, the compact is desirably sintered under pressure.

The cooling rate of the sintered body of silicon nitride immediately after the sintering process is an important control factor for crystallizing the grain boundary phase. If the sintered body is cooled too quickly at the cooling rate in excess of 100° C. per hour, the grain boundary phase in the sintered body structure would turn to an amorphous (glass) phase, and the volume ratio at which the liquid phase produced in the sintered body is present as a crystal phase in the grain boundary phase would become less than 20%, resulting in a reduction in both the mechanical strength and the thermal conductivity.

The temperature range in which the cooling rate is to be strictly adjusted can be defined with an allowance as a range from the predetermined sintering temperature of 1800° to 2000° C. to the temperature at which the liquid phase produced by the reaction of the sintering assistant agent is solidified. Incidentally, the solidifying point of the liquid phase is approximately from 1600° to 1800° C. when the above-mentioned sintering assistant agent is employed. By controlling the cooling rate of the sintered body at least in the range from the sintering temperature to the solidifying temperature of the liquid phase to be not greater than 100° C. per hour, preferably not greater than 50° C. per hour, there is finally obtained a high thermal conductive sintered body of silicon nitride which has the crystal phase not less than 20 vol. %, preferably not less than 50 vol. % in the grain boundary phase, and which is superior in both the thermal conductivity and the mechanical strength.

The sintered body of silicon nitride according to the present invention is manufactured, by way of example, through the following process. A material mixture is prepared by adding predetermined amounts of additives such as a sintering assistant agent and an organic binder, and other compounds such as $Al_2O_3$, AlN or Ti, Zr, Hf, etc., if necessary, to fine silicon nitride powder which has the predetermined powder size described above and contains impurities in a small amount. The material mixture is then pressed into a compact having a desired shape. The material mixture can be compacted by the widely-used mold pressing method or the sheet compacting method, e.g., the doctor blade method. Subsequent to the compacting step, the resultant pressed compact is preliminarily heated in a non-oxidizing atmosphere at temperature of 600° to 800° C. for 1 to 2 hours to sufficiently remove the added organic binder component for degreasing. The degreased compact is then sintered in an atmosphere of inert gas, such as nitrogen gas, hydrogen gas or argon gas, under pressure at temperature of 1800° to 2000° C. for a predetermined period of time. After cooling, the sintered body is machined by cutting and grinding to obtain the sintered body of silicon nitride having a desired shape.

The sintered body of silicon nitride manufactured according to the above method has the porosity not greater than 1.5%, the thermal conductivity not less than 60 W/(m.K) (at 25° C.), and superior mechanical characteristics with the three-point bending strength not less than 80 $kg/mm^2$ at room temperature.

The heater according to the present invention is featured in that a heating resistor and an insulator layer, as needed, are formed in a unitary structure over a high thermal conductive silicon nitride substrate manufactured as described above which has the thermal conductivity not less than 60 W/(m.K), preferably not less than 80 W/(m.K).

The heating resistor is preferably made of at least one element or compound selected from the group consisting of Ti, Zr, Hf, V, Cr, Mo, W, NiCr, Nesa film, Ta–Si, $Ta_2N$, Ta–$SiO_2$, and Nb–$SiO_2$.

The heating resistor containing an alloy of high melting metal (tungsten or molybdenum), as a main ingredient, is superior in adhesion to the silicon nitride substrate, and hence can provide a highly durable heater. Particularly, the heating resistor made of a tungsten—platinum alloy is superior in oxidation resistant, and hence can provide a long-lived heater. The heating resistor may be formed by a metalizing process.

Further, the heater may be constructed by forming an insulator layer on the silicon nitride substrate (structural member) so as to cover the heating resistor. The presence of the insulator layer makes it possible to effectively prevent the conductive heating resistor from coming into electrical contact (short-circuit) with any of component parts in the surroundings and from malfunctioning. Widely-used alumina, mullite, $Si_3N_4$, etc. can be employed as materials of the insulator layer. Particularly using the same material as that of the silicon nitride substrate to form the insulator layer, it is possible to make the insulator layer and the silicon nitride substrate have the same coefficient of thermal expansion, to prevent both the members from peeling off due to the difference in thermal expansion, and hence to fabricate a highly durable heater.

The silicon nitride substrate, the heating resistor and the insulator layer of the heater can be formed in a unitary structure by simultaneous baking (co-fire process). In this case, a homogeneous material mixture is prepared by adding a sintering assistant agent, an organic binder, a solvent, etc. to fine silicon nitride powder which contains oxygen and impurities in small amounts not greater than the predetermined values. The resultant mixture is injected into a sheet-like shape by the doctor blade method, for example, to form a green sheet. A wiring pattern is printed on the resultant green sheet by screen printing, for example, using a conductor (heating resistor) paste which contains tungsten or molybdenum powder, as a primary ingredient, to thereby form a heating resistor.

Then, an insulating paste containing an insulator, e.g., alumina, mullite or $Si_3N_4$, as a primary ingredient, is printed by screen printing all over the substrate surface in such a manner as to overlie the heating resistor, thereby forming an insulator layer. Through holes for leading both ends of the heating resistor to the outside of the insulator layer are formed in the insulator layer and filled with the conductor paste to form lead pads. The resultant heater laminate is degreased and baked (co-fired) together in an inert atmosphere such as $N_2$ gas, thereby obtaining a heater having a desired shape. By so forming the silicon nitride substrate, the heating resistor and the insulator layer together by simultaneous sintering, adhesion between the adjacent members is increased and, in particular, the electric resistance of the heating resistor is effectively prevented from changing over time.

The thermal head according to the present invention is featured in that a heating resistor and a wear-resistant layer are formed in a unitary structure over the surface of a high thermal conductive silicon nitride sintered body which contains a rare earth element in the range of 1.0 to 7.5 wt. % calculated as oxide thereof and Li, Na, K, Fe, Ca, Mg, Sr, Ba, Mn and B as impurity cationic elements in a total amount not greater than 0.3 wt. %, and has the thermal conductivity not less than 60 W/(m.K), preferably not less than 80 W/(m.K).

As another form of the thermal head, a heating resistor and a wear-resistant layer may be formed in a unitary structure over the surface of a high thermal conductive silicon nitride sintered body which consists of silicon nitride particles and a grain boundary phase, a crystal compound phase in the grain boundary phase being not less than 20 vol. %, preferably not less than 50 vol. %, with respect to the entire grain boundary phase, and has the thermal conductivity not less than 60 W/(m.K), preferably not less than 80 W/(m.K).

In other words, the thermal head of the present invention is manufactured by forming a heating resistor and a wear-resistant layer in a unitary structure on the high thermal conductive silicon nitride sintered body obtained as described above. The heating resistor generates heat upon application of a pulse voltage, causing heat-sensitive recording paper to develop a color in the form of dots. The heating resistor can be formed by preparing a material, e.g., $Ta_2N$, NiCr alloy, Nesa film, $Ta-SiO_2$ or Ta-Si, into a paste and then coating the paste by the film forming technique such as screen printing.

The heater and the thermal head constructed as described above can provide not only superior thermal response for ON-OFF operation of the voltage applied to the heating resistor, but also superior durability, because the ceramic substrate, which determines characteristics of mechanical strength and thermal response of the products, is formed of the novel high thermal conductive silicon nitride sintered body which has the thermal conductivity not less than 60 W/(m.K), preferably not less than 80 W/(m.K), in addition to the high mechanical strength inherently given to a sintered body of silicon nitride. In the thermal head, particularly, since the high thermal conductive silicon nitride sintered body is employed which has the thermal conductivity at least 2 to 5 times that of alumina conventionally used, the falling time required for the heating resistor, once heated up to the printing temperature, to cool down to predetermined temperature is reduced remarkably. Therefore, the repetition period (pulse cycle) of printing given by the sum of the rising time (heating-up time) and the falling time (heat releasing time) of the heating resistor temperature is shortened to a large extent. As a result, the thermal response of the thermal head can be greatly improved and the recording speed can be greatly increased.

DESCRIPTION OF THE PREFERRED EMBODIMENTS

Figure 1:
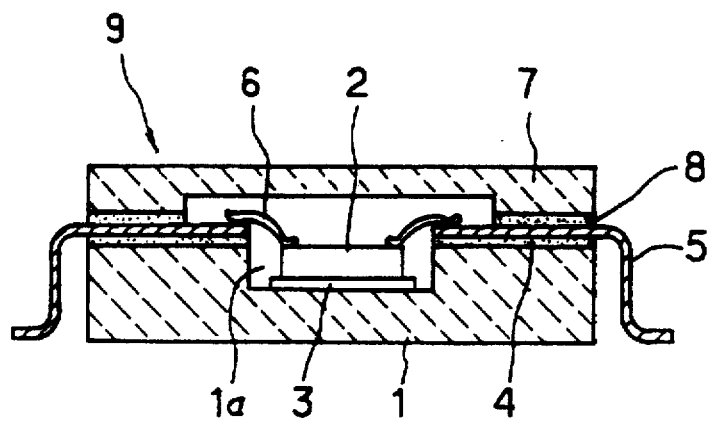
FIG. 1 is a sectional view showing the construction of one embodiment of a semiconductor package according to the present invention.

Hereinafter, the present invention will be described in more detail with reference to following Examples.

EXAMPLES 1-3

A material powder mixture was prepared by adding 5 wt. % $Y_2O_3$ (yttrium oxide) powder with a mean powder size of 0.7 μm and 1.5 wt. % $Al_2O_3$ (alumina) powder with a mean powder size of 0.5 μm, as a sintering assistant agent, to silicon nitride material powder which contained oxygen of 1.7 wt. %, impurity cationic elements of 0.15 wt. % and α-phase silicon nitride of 97 wt. %, and had a mean powder size of 0.55 μm, wet-mixing the materials in ethyl alcohol for 24 hours, and drying the mixture. After adding a predetermined amount of an organic binder to the material powder mixture and homogeneously mixing it, the mixture was pressed under a compacting pressure of 1000 kg/cm² into a number of compacts each being 50 mm long×50 mm wide×5 mm thick. After degreasing the resultant pressed compacts at 700° C. for two hours, the degreased compacts were further compacted and sintered by holding them in a nitrogen gas atmosphere under 7.5 atm. at 1900° C. for 6 hours. Thereafter, the sintered bodies were cooled at different cooling rates of 100° C./hr (Example 1), 50° C./hr (Example 2) and 25° C./hr (Example 3) until the temperature in a sintering furnace was reduced down to 1500° C., by controlling an amount of power supplied to a heating unit associated with the sintering furnace. The cooled sintered bodies were then ground to fabricate respective silicon nitride sintered bodies of Examples 1 to 3.

COMPARATIVE EXAMPLES 1

A silicon nitride sintered body of Comparative Example 1 was prepared under the same conditions as in Example 1 except that the sintered body was cooled at a cooling rate (about 500° C./hr) as conventionally by turning off a power supply of the heating unit immediately after the completion of compacting and sintering.

COMPARATIVE EXAMPLES 2

A silicon nitride sintered body of Comparative Example 2 was prepared under the same conditions as in Example 1 except for using a silicon nitride material powder which contained oxygen of 1.5 wt. %, impurity cationic elements of 0.6 wt. % and α-phase silicon nitride of 93 wt. %, and had a mean powder size of 0.60 μm.

COMPARATIVE EXAMPLES 3

A silicon nitride sintered body of Comparative Example 3 was prepared under the same conditions as in Example 1 except for using a silicon nitride material powder which contained oxygen of 1.7 wt. %, impurity cationic elements of 0.7 wt. % and α-phase silicon nitride of 91 wt. %, and had a mean powder size of 1.1 μm.

For the silicon nitride sintered bodies of Examples 1 to 3 and Comparative Examples 1 to 3, the porosity, the thermal conductivity (at 25° C.) and an average value of the three-point bending strength at room temperature were measured. A ratio (volume) of the crystal phase in the grain boundary phase was also measured for each sintered body by the X-ray diffraction method. Measured results are shown in Table 1 below.

entirely formed of the amorphous phase and the thermal conductivity was reduced. When the silicon nitride powder containing impurity cationic elements as much as 0.6 wt. % was used as with Comparative Example 2, the grain boundary phase was entirely formed of the amorphous phase and the thermal conductivity was reduced, even if the cooling rate of the sintered body was set to the same value as in Example 1.

Further, when the coarse silicon nitride powder having a mean powder size of 1.1 μm was used as with Comparative Example 3, the sintered body was not sufficiently compacted during the sintering process, and the mechanical strength and the thermal conductivity were both reduced.

EXAMPLES 4–12 AND COMPARATIVE EXAMPLES 4–7

As Examples 4 to 12, material mixtures were prepared by selecting composition ratios of the silicon nitride powder used in Example 1, $Y_2O_3$ powder and $Al_2O_3$ powder as shown in Table 2 below.

The resultant material mixtures were pressed and degreased under the same conditions as in Example 1. Then, the compacts were sintered under conditions shown in Table 2 and were ground to fabricate respective silicon nitride sintered bodies of Examples 4 to 12.

On the other hand, as Comparative Examples 4 to 7, material mixtures which contained, as shown in Table 2, an excessively small amount of $Al_2O_3$ (Comparative Example 4), an excessively small amount of $Y_2O_3$ (Comparative Example 5), an excessively large amount of $Al_2O_3$ (Comparative Example 6) and an excessively large amount of $Y_2O_3$ (Comparative Example 7), respectively, were prepared. The process from mixing of the materials to sintering was carried out under the same conditions as in Example 1 to fabricate respective silicon nitride sintered bodies of Comparative Examples 4 to 7.

TABLE 1

| Sample | Cooling Rate until 1500° C. after sintering (°C./hr) | Porosity (%) | Ratio of Crystal Phase in Grain Boundary Phase (vol. %) | Thermal Conductivity (W/(m · K)) | Three-Point Bending Strength (kg/mm²) |
|---|---|---|---|---|---|
| Example. 1 | 100 | 0.2 | 30 | 70 | 102 |
| Example. 2 | 50 | 0.2 | 50 | 92 | 101 |
| Example. 3 | 25 | 0.2 | 80 | 115 | 98 |
| Comparative Example. 1 | 500 | 0.2 | 0 | 40 | 100 |
| Comparative Example. 2 | 100 | 0.3 | 0 | 27 | 90 |
| Comparative Example. 3 | 100 | 2.5 | 0 | 20 | 78 |

As is apparent from the results shown in Table 1, in the silicon nitride sintered bodies of Examples 1 to 3, since the cooling rate of the sintered body immediately after the completion of compacting and sintering was set to be smaller than in Comparative Example 1, the grain boundary phase contained the crystal phase and the sintered body having a higher ratio of the crystal phase was more superior in thermal conductivity, heat releasing and mechanical strength.

On the other hand, when the cooling rate of the sintered body was set to be large to effect quick cooling as with Comparative Example 1, the grain boundary phase was For each of the silicon nitride sintered bodies of Examples 4 to 12 and Comparative Examples 4 to 7, the porosity, the thermal conductivity (at 25° C.), an average value of the three-point bending strength at room temperature, and a ratio of the crystal phase in the grain boundary phase by the X-ray diffraction method were measured under the same conditions as in Example 1. Measured results are shown in Table 2 below.

TABLE 2

| Sample | Composition (wt %) | | | Sintering Conditions Temp. × Time (°C.) (hr) | Cooling Rate until 1500° C. (°C./hr) | Porosity (%) | Crystal Phase Ratio (vol. %) | Thermal Conductivity (W/m · K) | 3-Point Bending Strength (kg/mm$^2$) |
|---|---|---|---|---|---|---|---|---|---|
| | $Si_3N_4$ | $Y_2O_3$ | $Al_2O_3$ | | | | | | |
| Example 4 | 94.5 | 5 | 0.5 | 1900 × 6 | 50 | 0.4 | 55 | 85 | 94 |
| Example 5 | 94 | 5 | 1 | 1900 × 6 | 50 | 0.3 | 50 | 88 | 97 |
| Example 6 | 93 | 5 | 2 | 1900 × 6 | 50 | 0.2 | 45 | 90 | 102 |
| Example 7 | 96 | 2 | 2 | 1900 × 6 | 50 | 0.9 | 25 | 62 | 90 |
| Example 8 | 92 | 7.5 | 0.3 | 1900 × 6 | 50 | 0.3 | 92 | 120 | 101 |
| Example 9 | 94 | 5 | 1 | 1900 × 6 | 100 | 0.2 | 42 | 80 | 100 |
| Example 10 | 94 | 5 | 1 | 1900 × 6 | 25 | 0.2 | 90 | 120 | 97 |
| Example 11 | 97 | 2 | 1 | 1950 × 6 | 50 | 1.2 | 45 | 81 | 95 |
| Example 12 | 94 | 5 | 1 | 1950 × 6 | 10 | 0.1 | 95 | 128 | 96 |
| Comp. Ex. 4 | 94.8 | 5 | 0.1 | 1900 × 6 | 100 | 2.5 | 50 | 51 | 80 |
| Comp. Ex. 5 | 97 | 1 | 2 | 1900 × 6 | 100 | 3.0 | 15 | 35 | 72 |
| Comp. Ex. 6 | 92 | 5 | 3 | 1900 × 6 | 100 | 0.1 | 10 | 40 | 105 |
| Comp. Ex. 7 | 89 | 10 | 1 | 1900 × 6 | 100 | 0.1 | 38 | 50 | 85 |

As is apparent from the results shown in Table 2, any of the sintered bodies of Examples 4 to 12, which contained $Y_2O_3$ and $Al_2O_3$ in amounts meeting the requirements and were cooled at cooling rates meeting the requirements after the sintering, had high values of thermal conductivity and mechanical strength. On the other hand, when at least one of $Y_2O_3$ and $Al_2O_3$ was added in an excessively small or large amount as with Comparative Examples 4 to 7, it was confirmed that the three-point bending strength or the thermal conductivity was deteriorated owing to that the sintered body was not sufficiently compacted, or the grain boundary phase became excessive, or the ratio of the crystal phase in the grain boundary phase was too small.

EXAMPLES 13–16

As Examples 13 to 16, silicon nitride sintered bodies of Examples 13 to 16 were manufactured under the same conditions as in Example 1 except that rare earth oxides shown in Table 3 below were employed instead of $Y_2O_3$ powder used in Example 1.

For each of the sintered bodies of Examples 13 to 16, the porosity, the thermal conductivity (at 25° C.), an average value of the three-point bending strength at room temperature, and a ratio of the crystal phase in the grain boundary phase by the X-ray diffraction method were measured under the same conditions as in Example 1. Measured results are shown in Table 3 below.
[Table 3]

A description will now be made of embodiments where the high thermal conductive silicon nitride sintered body according to the present invention is applied to various products such as semiconductor device parts, sliding members, high-temperature corrosion-resistant members, and enclosures, with reference to following Examples.

EXAMPLE 17

FIG. 1 is a sectional view showing the construction of one embodiment of a semiconductor package according to the present invention, the view particularly illustrating a QFP (Quad Flat Package) to which Fe—Ni-base lead frames 5 are joined. In FIG. 1, a ceramic substrate 1 has a cavity 1a formed therein to house a semiconductor chip 2. In the cavity 1a of the ceramic substrate 1, there is provided a chip mount 3 to which the semiconductor chip 2 is joined and mounted. The lead frames 5 are joined by fixing glass 4 or the like to the same side as where the semiconductor chip 2 is mounted, i.e., to opposite projected upper surfaces of the ceramic substrate 1 at its outer end portions. The lead frames 5 are electrically connected to corresponding electrodes of the semiconductor chip 2 by bonding wires 6. A ceramic sealing member (cap or lid) 7 is joined through the lead frames 5 to the upper side of the ceramic substrate 1, to which the semiconductor chip 2 has been joined and mounted, by sealing glass 8, e.g., low melting point glass. The semiconductor chip 2 is hermetically sealed off by the sealing member 7.

The ceramic substrate 1 and the ceramic sealing member 7 are each formed of the high thermal conductive silicon

TABLE 3

| Sample | Rare Earth Oxide Substituted for $Y_2O_3$ | Porosity (%) | Ratio of Crystal Phase in Grain Boundary Phase (vol. %) | Thermal Conductivity (W/(m · K)) | Three-Point Bending Strength (kg/mm$^2$) |
|---|---|---|---|---|---|
| Example 13 | $CeO_2$ | 0.1 | 50 | 88 | 98 |
| Example 14 | $Nd_2O_3$ | 0.2 | 55 | 90 | 95 |
| Example 15 | $Yb_2O_3$ | 0.2 | 65 | 100 | 102 |
| Example 16 | $Dy_2O_3$ | 0.1 | 55 | 98 | 100 |

As is apparent from the results shown in Table 3, it was confirmed that any of the sintered bodies of Examples 13 to 16, in each of which the rare earth oxide was substituted for $Y_2O_3$, had properties comparable to the sintered body containing $Y_2O_3$.

nitride sintered body of any of above Examples 1 to 16. A semiconductor package 9 of this Example 17 is thus constructed.

Since the ceramic substrate 1 and the ceramic sealing member 7 are each formed of the silicon nitride sintered body which is superior in both thermal conductivity and mechanical strength, the semiconductor package has a good characteristic of heat releasing and is sufficiently adaptable for an increase in output power and heat generation of the semiconductor chip 2. In addition, the semiconductor package is less susceptible to cracks due to the external force imposed when mounted or cracks due to the thermal stress caused by the difference in thermal expansion, and hence can ensure stable reliability of the operation for a long term.

Example 17 is the case where both ceramic substrate 1 and the ceramic sealing member 7 are constituted by using the high thermal conductive silicon nitride sintered body of this invention. However, even in a case where at least the ceramic substrate 1 is constituted by using the high thermal conductive silicon nitride sintered body of this invention, improvements for the semiconductor package can be effectively obtained, and such modifications or configurations are, of course, included within the scope of the present invention.

EXAMPLE 18

Figure 2:
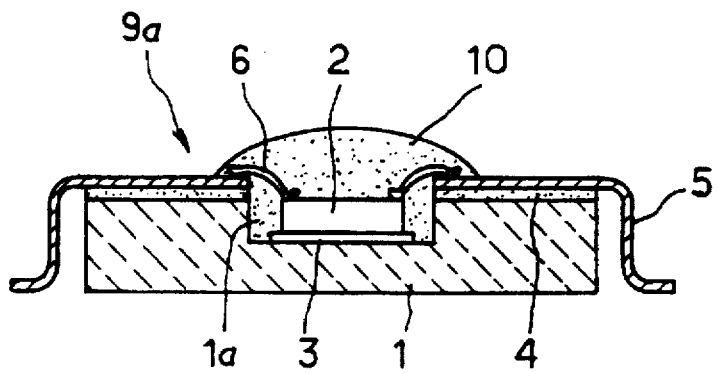
FIG. 2 is a sectional view showing the construction of another embodiment of the semiconductor package according to the present invention.

FIG. 2 is a sectional view showing the construction of another embodiment of the semiconductor package according to the present invention. A semiconductor package 9a shown in FIG. 2 is of the same construction as in Example 17 except that sealing glass 10 is poured into the cavity 1a to thereby hermetically seal off the semiconductor chip 2, instead of using the ceramic sealing member 7 in the semiconductor package 9 of FIG. 1.

The semiconductor package 9a is also improved in both heat releasing and durability as with Example 17.

EXAMPLE 19

Figure 3:
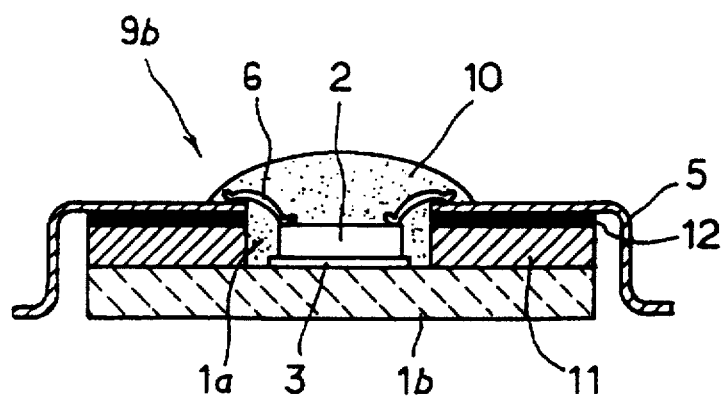
FIG. 3 is a sectional view showing the construction of still another embodiment of the semiconductor package according to the present invention.

FIG. 3 is a sectional view showing the construction of still another embodiment of the semiconductor package according to the present invention.

In a semiconductor package 9b shown in FIG. 3, instead of using the ceramic substrate 1 shown in FIG. 2 which has the cavity 1a for housing the semiconductor package 9a, a flat ceramic substrate 1b is used, a rectangular frame-shaped metal ring 11 is fixed unitarily to an upper surface of the ceramic substrate 1b, and the lead frames 5 are joined unitarily to an upper surface of the metal ring 11 through a solder layer 12. Further, sealing glass 10 is poured into the cavity 1a formed at the center of the metal ring 11 to thereby hermetically seal off the semiconductor chip 2.

The semiconductor package 9b of this Example 19 is further improved in heat releasing, because the ceramic substrate 1b is formed of the high thermal conductive silicon nitride sintered body and the metal ring 11 having the high thermal conductivity is employed.

While above Examples 17 to 19 are illustrated as using QFPs (Quad Flat Packages) as the semiconductor packages, the present invention is not limited thereto, but is equally applicable to other semiconductor packages such as DIP (Dual In-line Package) type using lead frames, BGA (Ball Grid Array) type using solder balls, PGA (Pin Grid Array) type using lead pins, and LGA (Land Grid Array) type using input/output lands.

Figure 4:
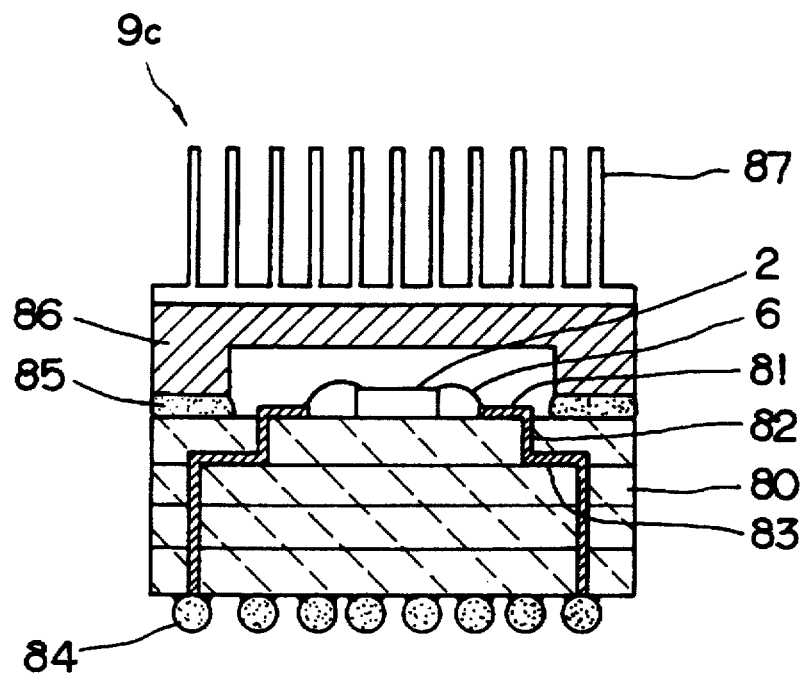
FIG. 4 is a sectional view showing the construction of still another embodiment of the semiconductor package according to the present invention.
Figure 5:
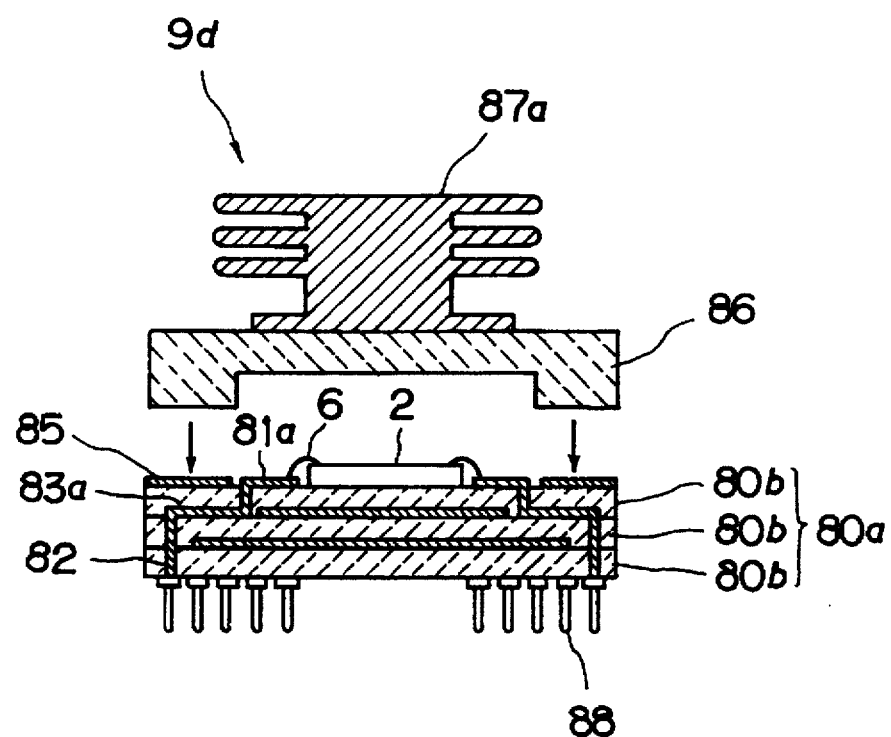
FIG. 5 is a sectional view showing the construction of still another embodiment of the semiconductor package according to the present invention.

FIGS. 4 and 5 are sectional views showing the exemplified structures of BGA and PGA type semiconductor packages 9c and 9c, respectively.

The BGA type semiconductor package 9c shown in FIG. 4 is constructed as follows. The semiconductor chip 2 is joined to one surface of a multi-layered ceramic circuit substrate 80 formed of the high thermal conductive $Si_3N_4$ sintered body according to the present invention, and a surface wiring layer 81 is formed on the same surface. Internal wiring layers 83 formed of, e.g., through holes 82 filled with conductors are disposed inside the multi-layered ceramic circuit substrate 80, and the surface wiring layer 81 is electrically connected to the internal wiring layers 83 via the through holes 82. Further, solder balls 84 serving as projected connectors (bumps) are formed in positions where the through holes 82 are exposed to a rear surface of the multi-layered ceramic circuit substrate 80. The surface wiring layer 81 and the solder balls 84 are electrically connected via the through holes 82 and the internal wiring layers 83. Also, electrodes of the semiconductor chip 2 are electrically connected to the surface wiring layer 81 by the bonding wires 6. The semiconductor chip 2 is hermetically sealed off by a $Si_3N_4$ lid 86 bonded to the multi-layered ceramic circuit substrate 80 by an insulating adhesive 85, and pin-shaped heat releasing fins 87 are joined to the $Si_3N_4$ lid 86. With the above construction, there can be obtained a BGA type semiconductor package which is superior in both heat releasing and mechanical strength.

Meanwhile, the PGA type semiconductor package 9d shown in FIG. 5 is constructed as follows. The semiconductor chip 2 such as an LSI or power IC is mounted to an upper surface of a multi-layered ceramic circuit substrate 80a formed of the high thermal conductive $Si_3N_4$ sintered body according to the present invention, and lead pins 88 serving as connection terminals are joined to a lower surface of the multi-layered ceramic circuit substrate 80a. The upper surface of the multi-layered ceramic circuit substrate 80a to which the semiconductor chip 2 is mounted is covered by the $Si_3N_4$ lid 86 being channel-shaped in section. Heat releasing fins 87a are provided on an upper surface of the $Si_3N_4$ lid 86. The multi-layered ceramic circuit substrate 80a is a multi-layered wiring board formed by laminating a plurality of ceramic layers 80b into a one-piece body, and an internal wiring layer 83a having a predetermined wiring pattern is formed on each of the ceramic layers 80b. The internal wiring layers 83a include through holes 82 formed in the ceramic layers 80 and filled with conductors. Then, a surface wiring layer 81a is formed on the same surface of the multi-layered ceramic circuit substrate 80a as where the semiconductor chip is mounted, and is electrically connected to the lead pins 88 via the internal wiring layers 83a and the through holes 82. The mounted semiconductor chip 2 is electrically connected to the surface wiring layer 81a by the bonding wires 6. With the above construction, there can be obtained a PGA type semiconductor package which is superior in both heat releasing and mechanical strength.

EXAMPLE 20

Figure 6:
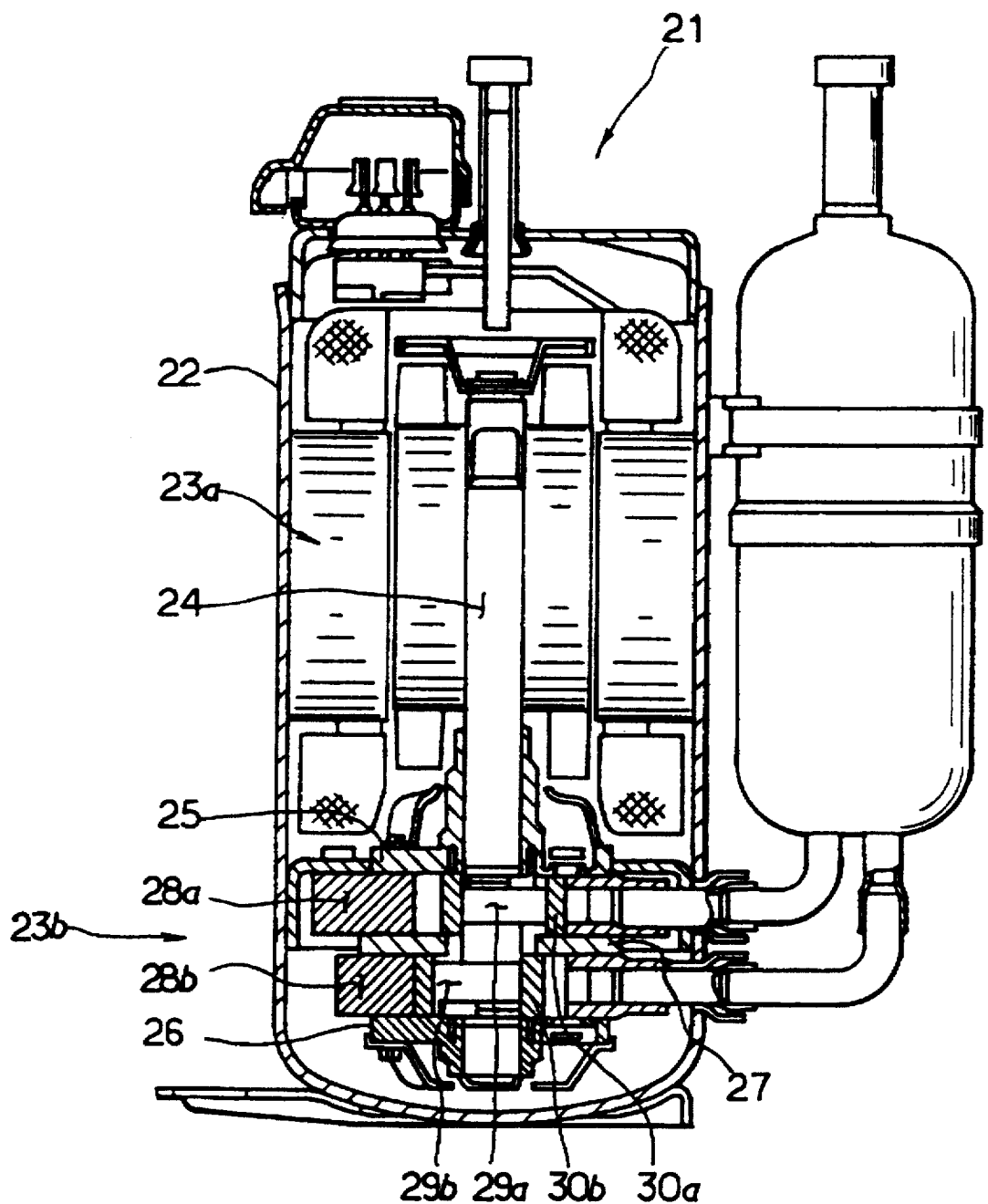
FIG. 6 is a vertical sectional view of a rotary compressor in which a high thermal conductive silicon nitride structural member according to the present invention is used as a sliding member.
Figure 7:
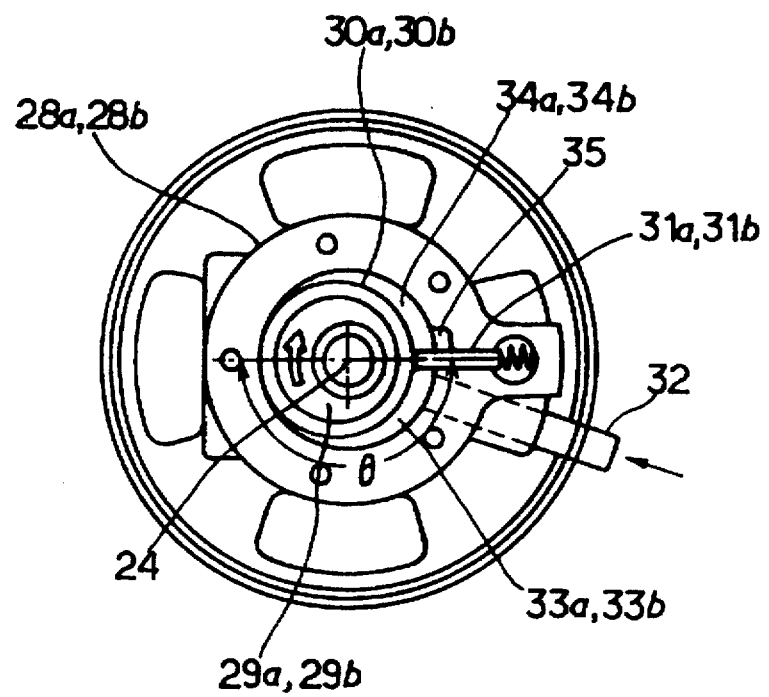
FIG. 7 is a horizontal sectional view of the rotary compressor shown in FIG. 6.

FIGS. 6 and 7 are a vertical and horizontal sectional view, respectively, showing the exemplified structure of an enclosed rotary compressor in which the high thermal conductive silicon nitride sintered body according to the present invention is used as a structural member, particularly, a sliding member.

In an illustrated compressor 21, a motor 23a and a compressing element 23b are installed within a casing 22. The compressing element 23b is arranged such that a rotary shaft 24 extending from the motor 23a is inserted through a main bearing 25 and a sub-bearing 26 with two cylinders 28a, 28b disposed through a partition plate 27 between the main bearing 25 and the sub-bearing 26. In the cylinders 28a, 28b, cylindrical rollers 30a, 30b are fitted over eccentric portions 29a, 29b formed on the rotary shaft 24 and vanes 31a, 31b are disposed to be normally pressed into contact with the rollers 30a, 30b rotating in an eccentric manner, respectively, as shown in FIG. 7. The vanes 31a, 31b are reciprocally moved upon rotation of the eccentric portions 29a, 29b and the rollers 30a, 30b while keeping slide contact with outer peripheral surfaces of the corresponding rollers, to thereby partition the interiors of the cylinders 28a, 28b in terms of pressure.

In the compressor 21 thus constructed, when the motor 23 is driven to rotate the rollers 30a, 30b eccentrically in the cylinders 28a, 28b, gas sucked into suction chambers 33a, 33b within the cylinders 28a, 28b through an intake port 32 is compressed while being moved toward compression chambers 34a, 34b, and then discharged through an outlet port 35.

As a result of forming the cylinders 28a, 28b in the compressor 21 with the high thermal conductive silicon nitride sintered body of any of above Examples 1 to 16, conducting an endurance test of continuously operating the compressor for 3000 hours, and measuring a wear of the inner surface of each cylinder 28a, 28b, it was confirmed that the wear was reduced to about 1/15 of that in the prior art cylinder made of FC200, i.e., a conventionally used metallic material, and the cylinders were superior in both wear resistance and durability. It was also found that any abnormal phenomenon such as burning of the cylinder inner surface was not appeared and an initial sliding characteristic was improved.

Also, as a result of forming the rollers 30a, 30b with the high thermal conductive silicon nitride sintered body of any of above Examples 1 to 16, conducting an endurance test in a similar manner, and measuring a wear of each roller 30a, 30b, the wear was reduced to about 1/15 of that in the prior art roller made of Monichro (Mo—Ni—Cr) cast iron.

Further, as a result of forming the vanes 31a, 31b with the high thermal conductive silicon nitride sintered body of any of above Examples 1 to 16, and measuring a wear of each vane after an endurance test, it was confirmed that the wear was likewise reduced to about 1/15 of that in the prior art vane made of SKH-51.

While an actual endurance test was not conducted on the main bearing 25, the sub-bearing 26 and the partition plate 27 as other sliding members, these parts are also expected to exhibit superior wear resistance and durability as with the cylinders and the rollers formed of the high thermal conductive silicon nitride sintered body.

EXAMPLE 21

Figure 8:
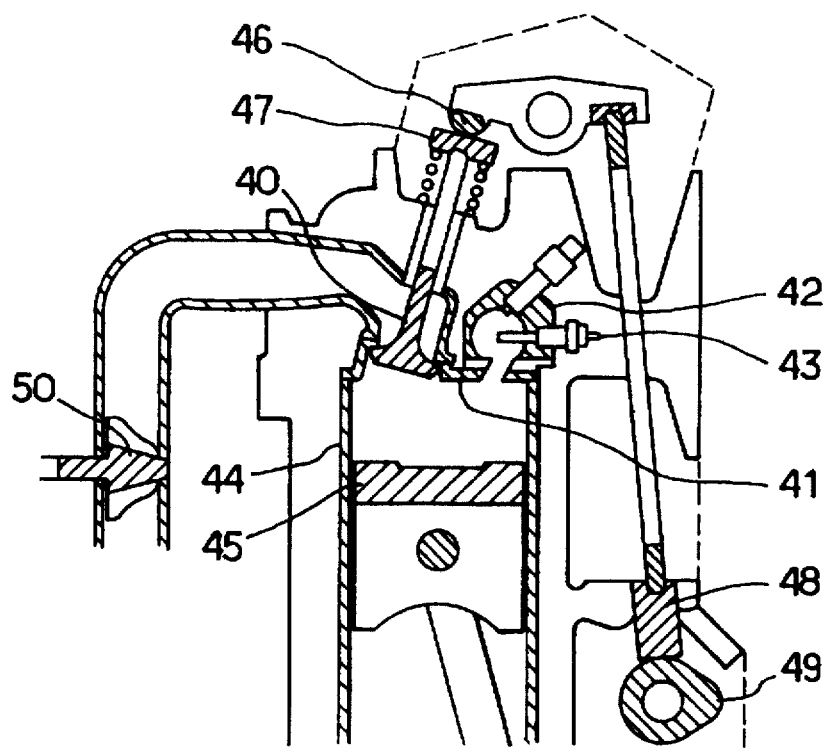
FIG. 8 is a sectional view showing the construction of a diesel engine in which the high thermal conductive silicon nitride structural member according to the present invention is used as a high-temperature corrosion-resistant member and a sliding member.

FIG. 8 is a sectional view showing the construction of a diesel engine in which the high thermal conductive silicon nitride sintered body according to the present invention is used as a high-temperature corrosion-resistant member and a sliding member. By using the high thermal conductive silicon nitride sintered bodies of above Examples 1 to 16, which are also superior in high-temperature strength, as component parts of a thermal engine, e.g., a diesel engine as shown in FIG. 8, the operating temperature can be set to a higher value than in the parts made of conventional metallic materials, and hence thermal efficiency can be improved remarkably.

Depending on required characteristics, the silicon nitride sintered bodies of above Examples 1 to 16 can be practically applied to various structural parts. These structural parts include high-temperature corrosion-resistant members such as a cylinder head 40 which is repeatedly brought into contact with a valve 40 in a combustion gas atmosphere at high temperature, a body of the valve 40, as well as a hot plug 42 and a glow plug 43 for a preliminary combustion chamber. Other applicable structural members are a cylinder liner 44, a piston crown 45 and so on which are moved at a high speed while sliding mutually, are kept in contact with the combustion gas at high temperature, and hence require both high wear resistance and high corrosion resistance. The silicon nitride sintered bodies of above Examples can also be applied to parts around the engine cylinder, i.e., sliding members such as a rocker arm tip 46 and a top seat 47; a tappet 48 and a cam 49; etc. which are moved reciprocally to move the valve 40 back and forth while sliding mutually.

By employing the silicon nitride sintered body of any of above Examples as high-temperature corrosion-resistant members and sliding members as illustrated in the diesel engine of this Example 21, wear resistance and corrosion resistance of those structural members can be both improved remarkably in comparison with conventional metallic members. This makes it possible to increase the engine operating temperature and hence to improve thermal efficiency.

Another part which is applicable to not only the diesel engine shown in FIG. 8, but also a gasoline engine, is a rotor (rotating blade) 50 of a turbocharger (supercharger) for pressurizing combustion and introducing it to the engine. By forming the turbocharger rotor 50 with the silicon nitride sintered body of any of above Examples to reduce the rotor weight, acceleration response of the turbocharger can also be improved.

EXAMPLE 22

Figure 9:
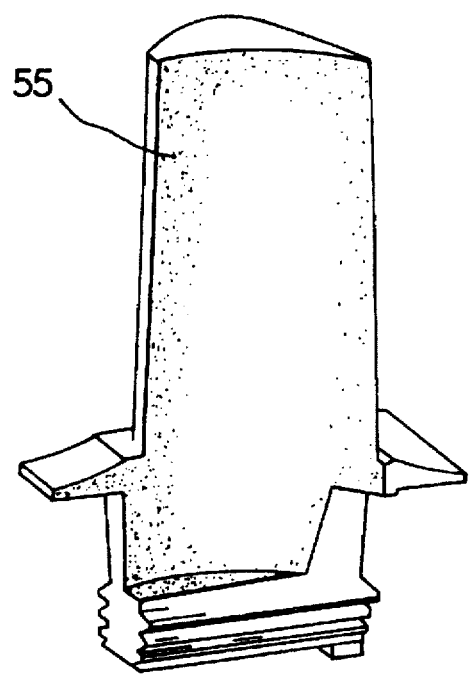
FIG. 9 is a perspective view of a moving blade of a gas turbine which is formed of the high thermal conductive silicon nitride structural member according to the present invention.

FIG. 9 is a perspective view showing still another embodiment in which a moving blade (rotor) 55 for use with an aircraft or a gas turbine for power generation is formed of the silicon nitride sintered body of any of above Examples 1 to 16. The moving blade 55 of the gas turbine is brought into contact with combustion gas at high temperature during the operation, and is subject to extremely large tensile stress acting in the longitudinal direction of the moving blade due to centrifugal forces produced upon rotation. By forming the moving blade 55 of the gas turbine with the silicon nitride sintered body of any of above Examples 1 to 16 which is superior in both strength and corrosion resistance at high temperature, durability of the moving blade can be improved remarkable in comparison with the conventional moving blade made of a super alloy. Further, since the blade weight becomes smaller than that of the metallic one, the magnitude of centrifugal forces to be generated can be reduced, and since any expensive super alloy material is not used, the blade can be manufactured at a lower cost. Additionally, the operating temperature can be increased in comparison with the case of using the metallic moving blade. This makes it possible to improve thermal efficiency in the operation of the gas turbine as a thermal engine, and hence to reduce fuel consumption.

While the silicon nitride sintered body is applied to the moving blade 55 of the gas turbine in this Example, it is also applicable to other structural members such as stationary blades (stators), combustion tubes, heat exchangers and so on of gas turbines.

EXAMPLE 23

Figure 10:
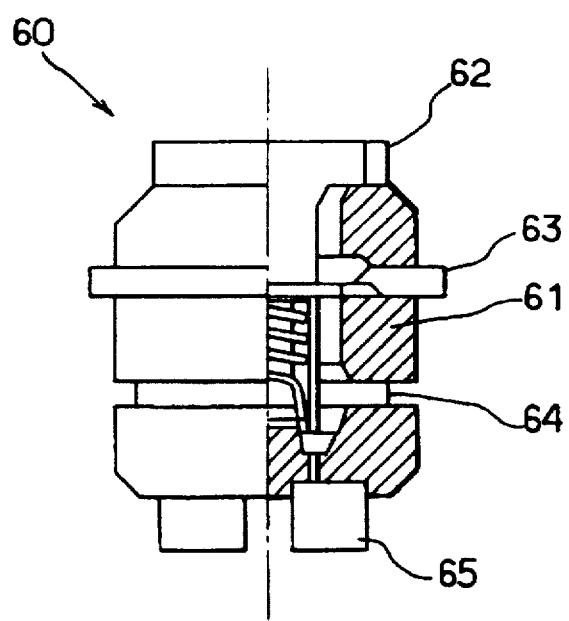
FIG. 10 is a sectional view showing the structure of a high-frequency receiving tube provided with a ceramic enclosure which is formed of the high thermal conductive silicon nitride structural member according to the present invention.

FIG. 10 is a sectional view showing the structure of a high-frequency receiving tube 60 provided with a ceramic enclosure as a structural member which is formed of the high thermal conductive silicon nitride sintered body of Example 3 which has the thermal conductivity of 115 W/(m.K) and the three-point bending strength of 98 kg/mm$^2$.

More specifically, in the high-frequency receiving tube 60 shown in FIG. 10, the silicon nitride sintered body prepared with the similar process as in Example 3 is cut and ground into a ceramic enclosure 61 having a predetermined shape, and an anode 62, a grid 63, a cathode 64 and a heater 65 are built in the ceramic enclosure 61.

Because the ceramic enclosure 61 is formed of the silicon nitride structural member which is superior in both thermal conductivity and structural strength, the high-frequency receiving tube 60 has a good characteristic of heat releasing, is sufficiently adaptable for power-up of reception characteristics, and exhibits superior durability.

While the silicon nitride structural member is applied to the ceramic enclosure of the high-frequency receiving tube 60 in this Example, its application is not limited to the receiving tube 60. The silicon nitride structural member can also be employed as a material for enclosures of electronic tubes such as X-ray tubes, magnetrons and arresters, or enclosures of various transmitting tubes, which particularly require a high degree of electric insulation, heat resistance and structural strength.

EXAMPLE 24

Figure 11:
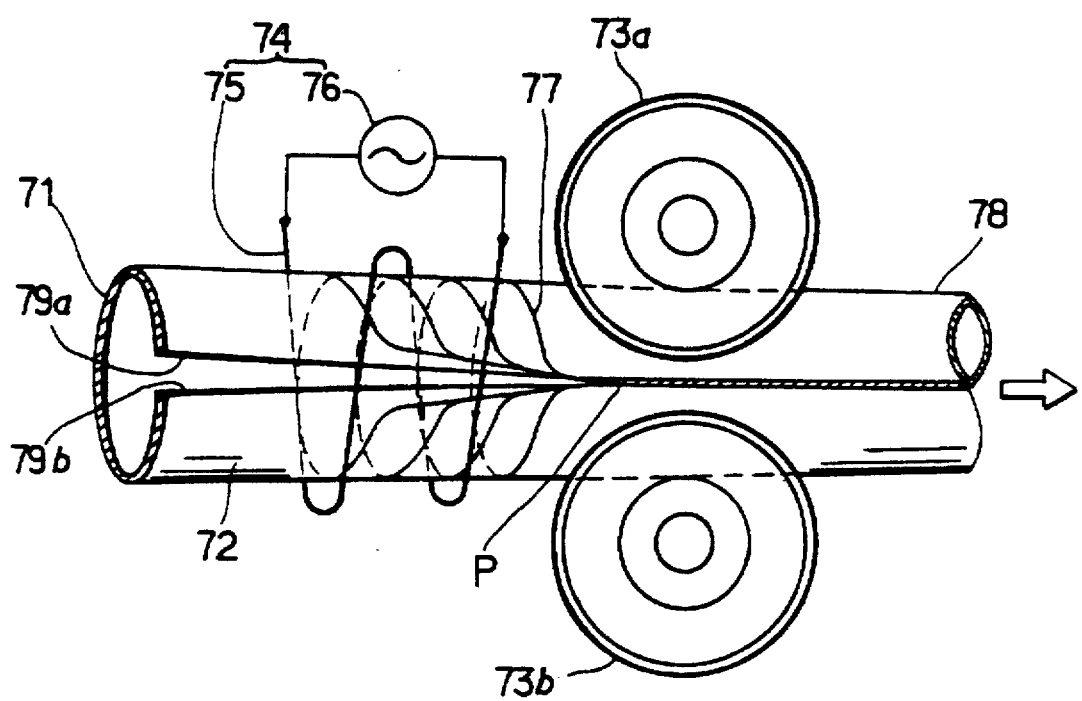
FIG. 11 is a side view of a welded pipe manufacture apparatus provided with shaping rolls which are each formed of the high thermal conductive silicon nitride structural member according to the present invention.

FIG. 11 is a side view showing an embodiment in which the silicon nitride sintered body according to the present invention is applied to shaping rolls of a welded pipe manufacture machine. As shown in FIG. 11, the welded pipe manufacture machine comprises a plurality of shaping rolls 73a, 73b . . . for pressing a strip steel 71 of desired dimensions in predetermined directions so as to form a cylindrical open-pipe 72, and a high-frequency welder 74. The high-frequency welder 74 comprises a work coil 75 disposed just upstream of a welding point P of the open pipe 72 to surround the pipe's outer circumference, and a power supply 76 for supplying a high-frequency current to the work coil 75. The shaping rolls 73a, 73b are each formed by cutting and grinding the silicon nitride sintered body prepared with the similar process as in Example 3.

The strip steel 71 fed as a raw material is pressed by a plurality of shaping rolls (not shown) so that it is gradually formed into the circular open pipe 72. When the open pipe 72 passes through the work coil 75 of the high-frequency welder, a heating current is induced in the open pipe 72 to flow along current paths 77 shown in FIG. 11. Because the currents flow in abutting edges 79a, 79b of the open pipe 72, the edges jointly defining a V-shape, substantially parallel to each other in opposite directions, those currents are concentrated in the abutting edges 79a, 79b due to the so-called proximity effect of high-frequency currents. As a result, the abutting edges 79a, 79b are heated up to high temperature by the Joule's heat generated by the currents. Then, the open pipe 72 is pressed sideways by the shaping rolls (squeezing roll and guide roll) 73a, 73b disposed just downstream of the high-frequency welder 74, so that the abutting edges 79a, 79b of the open pipe 72 are welded together to form a welded pipe 78.

As a material of the shaping rolls, there has hitherto been usually employed a metallic material such as a hard metal having a good characteristic of wear resistance. However, the conventional shaping rolls made of the hard metal have accompanied various problems below. Roll bearings are damaged in a short period of time to cause abnormal vibration, resulting in failed products; or the shaping rolls are cracked, deformed and/or damaged due to impact forces acting upon them, thereby deteriorating surface properties of the product; or the shaping rolls are broken due to thermal shocks caused by cooling water sprayed to prevent the rolls from overly increasing in temperature.

In this Example, since the shaping rolls 73a, 73b are each formed of the silicon nitride sintered body which is superior in high-temperature strength, thermal shock resistance, electric insulation and wear resistance, the stray current, etc. can be effectively prevented from leaking out of the high-frequency welder 74, and hence the bearings can be effectively prevented from being damaged due to electrolytic erosion induced by the leaked current. Also since the silicon nitride sintered body has smaller weight and higher wear resistance than the conventional materials, maintenance and handling of the rolls are facilitated, the rolls are less susceptible to damage and deformation, and quality of the welded pipe as a product can be improved remarkably.

As a result of actually using the shaping rolls 73a, 73b of this Example, it was confirmed that a current was hardly leaked from the high-frequency welder 74, the power consumed for welding was reduced about 10% in comparison with the case of using the conventional rolls made of the hard metal, and hence a significant power saving effect could be achieved. Further, damages of the bearings, etc. caused by electrolytic erosion were so small that the total working time of the rolls became about 7 times as long as that of the conventional rolls made of the hard metal. Consequently, maintenance and support work, e.g., roll exchange, could be simplified remarkably.

In above Examples 17 to 24, the silicon nitride sintered body according to the present invention is applied to the ceramic substrate of the semiconductor package, the sliding members of the compressor, the high-temperature corrosion-resistant members and the sliding members of the engine and the gas turbine, the enclosure, and the shaping rolls of the steel pipe manufacture machine. However, the silicon nitride sintered body according to the present invention is not limited to the above members in its application, but is applicable to a variety of fields owing to superior characteristics of dielectric strength, wear resistance, thermal shock resistance, light weight, resistance to molten metal, and corrosion resistance, in addition to the high thermal conductivity along with the inherent high mechanical strength.

For example, in view of that the silicon nitride sintered body according to the present invention is less subject to wetting by various molten metals and is highly resistant to corrosion, it can be applied to cylinder members and plunger members of dicasting apparatus for Zn and so on. Also, the silicon nitride sintered body is suitable as a melt-resistant material of crucibles and jig members for raising single crystals of metals and metal compounds. By utilizing superior characteristics of dielectric strength, weather resistance and toughness, it is also applicable to insulators for holding high-voltage lines. Further, by utilizing superior characteristics of mechanical strength, rigidity, wear resistance and burning resistance, it can be used as a material for forming balls and inner and outer races of various bearings. Other applicable examples are structural parts for metal working such as extrusion dies employed to manufacture copper and copper alloys by extrusion molding, hot-rolling guide rollers, and pipe upsetting dies. Additionally, by utilizing high wear resistance, the silicon nitride sintered body can also be used as a structural member of a nozzle for ejecting highly hard particles therethrough in a blasting apparatus.

As described above, since the high thermal conductive silicon nitride sintered body according to the present invention is manufactured by adding the predetermined amount of a rare earth element to fine silicon nitride powder having predetermined values of purity and grain size, pressing and sintering the mixture, and setting a cooling rate of the sintered body immediately after the sintering process to be slow not higher than 100° C. per hour, the grain boundary phase in the sintered body structure is changed from the amorphous state into the state containing a crystal phase as opposed to the case of quickly cooling the sintered body by turning off power supply to the furnace as with the prior art, whereby the compact sintered body having the high mechanical strength and the high thermal conductivity can be obtained. Consequently, by applying the high thermal conductive silicon nitride sintered body of the present invention to structural members such as various sliding members, high-temperature corrosion-resistant members of gas turbines and automobile engines, ceramic enclosures of electronic tubes and receiving/transmitting tubes, and shaping rolls, as well as semiconductor packages, heaters, etc., durability, heat releasing and service life of the applied products can be improved remarkably, making the products adaptable for demand to increase output power and prolong service life.

Next, embodiments in which the high thermal conductive silicon nitride sintered body according to the present invention is applied to a heater will be described with reference to following Examples.

EXAMPLE 25

Figure 12:
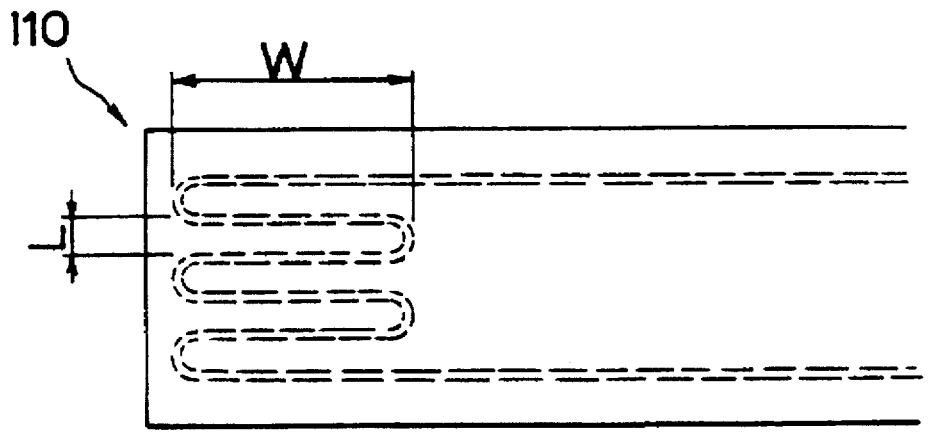
FIG. 12 is a plan view showing the construction of one embodiment of a heater according to the present invention.
Figure 13:
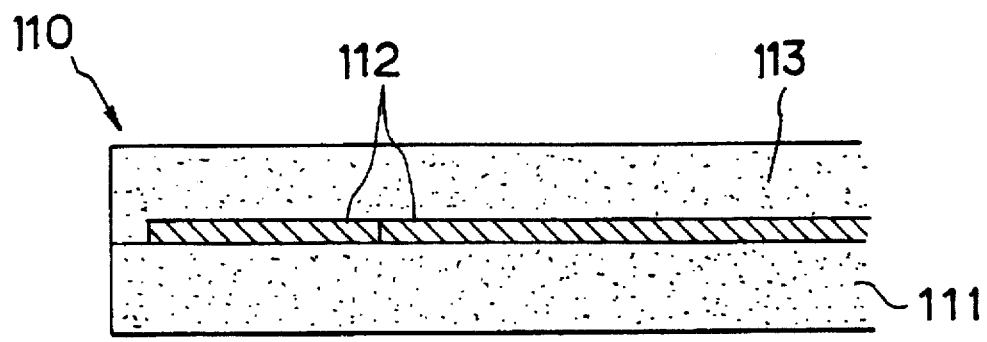
FIG. 13 is a sectional view of the heater shown in FIG. 12.

FIGS. 12 and 13 are a plan and sectional view, respectively, showing the construction of one embodiment of a heater according to the present invention. In a heater 110 illustrated as this Example, a ceramic substrate 111 is formed of the high thermal conductive silicon nitride sintered body which is prepared as with Example 3 and has the thermal conductivity of 115 W/(m.K) and the three-point bending strength of 98 kg/mm², a heating resistor 112 made of tantalum nitride (Ta₂N) is formed over the surface of the ceramic substrate 111, and an insulating layer 113 is formed unitarily onto the surface of the ceramic substrate 111 so as to cover the heating resistor 112. The ceramic substrate 111 made of the above high thermal conductive silicon nitride sintered body has dimensions of 20×10×1.0 mm, and the heating resistor 112 is formed in a zigzag pattern with a width W of 3 mm and a pitch L of 0.2 mm. The insulating layer 113 and the ceramic substrate 111 are each formed of the high thermal conductive silicon nitride sintered body prepared as with Example 3.

With the heater of this Example 25, since the ceramic substrate 111 and the insulating layer 113 jointly supporting the heating resistor 112 are each formed of the silicon nitride sintered body having the high mechanical strength and the high thermal conductivity, the heater can simultaneously exhibit both superior thermal response for ON-OFF operation of the voltage applied to the heating resistor 112 and superior durability.

Further, since the ceramic substrate 111 and the insulating layer 113 are made of the same material, it is possible to effectively prevent the occurrence of peeling-off or cracks due to the difference in thermal expansion between the two members, and hence to further improve durability.

EXAMPLE 26

Figure 14:
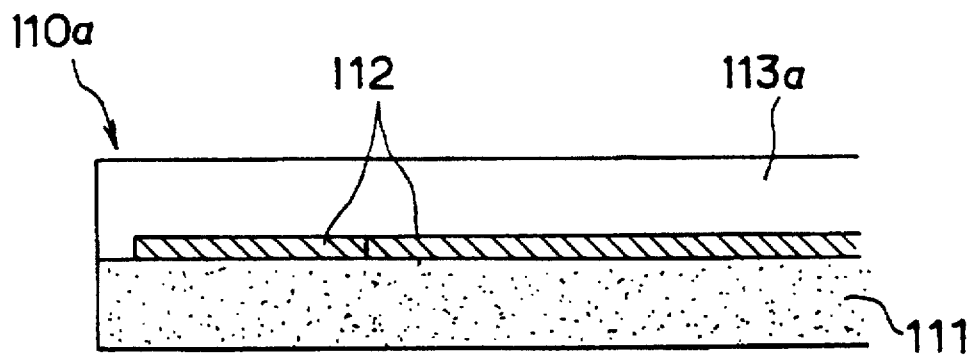
FIG. 14 is a sectional view showing another embodiment of the heater according to the present invention.

FIG. 14 is a sectional view showing another embodiment of the heater according to the present invention. Specifically, a heater 110a of this Example 26 shown in FIG. 14 is the same as the heater 110 of Example 25 except that an insulating layer 113a is formed of an insulating material such as a conventional Si₃N₄ sintered body, Al₂O₃ or mullite, instead of the insulating layer 113 formed of the high thermal conductive silicon nitride sintered body shown in FIG. 13.

Since the ceramic substrate 111 supporting the heating resistor 112 is formed of the high thermal conductive silicon nitride sintered body, the heater 110a of this Example 26 has the high thermal conductivity in the direction downward in FIG. 14 and exhibits high thermal response likewise.

EXAMPLE 27

Figure 15:
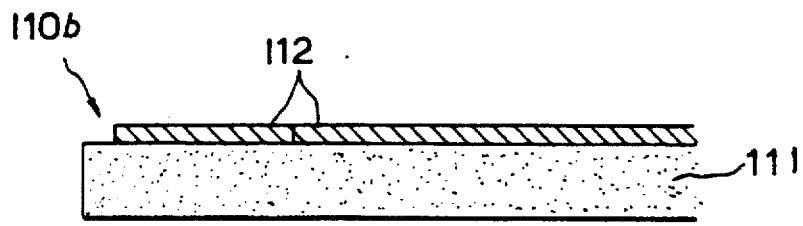
FIG. 15 is a sectional view showing still another embodiment of the heater according to the present invention.

FIG. 15 is a sectional view showing still another embodiment of the heater according to the present invention. Specifically, a heater 110b of this Example 27 shown in FIG. 15 is the same as the heaters 110a, 110b of Examples 25 and 26 except that the insulating layers are eliminated from the heaters 110a, 110b shown in FIGS. 13 and 14.

Thus, the heater 110b of this Example 27 has a simpler structure that no insulating layer is coated and the heating resistor 112 is exposed to the surface. Accordingly, the heater 110b of this Example 27 having the simpler structure can be sufficiently employed in the case where other conductors and so on which may short-circuit upon contact with the heating resistor 112 are not present around the heater 110b.

EXAMPLE 28

Figure 16:
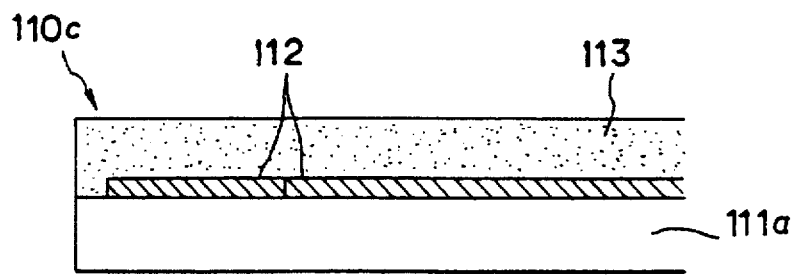
FIG. 16 is a sectional view showing still another embodiment of the heater according to the present invention.

FIG. 16 is a sectional view showing still another embodiment of the heater according to the present invention. Specifically, a heater 110c of this Example 28 shown in FIG. 16 is the same as the heater 110 of Example 25 except that a ceramic substrate 111a is formed of an insulating material such as a conventional Si₃N₄ sintered body, Al₂O₃ or mullite, instead of the ceramic substrate 111 formed of the high thermal conductive silicon nitride sintered body shown in FIG. 13.

Since the high thermal conductive silicon nitride sintered body is used as a material for forming the insulating layer 113, the heater 110c of this Example 28 has the high thermal conductivity in the direction upward in FIG. 16 and exhibits high thermal response likewise.

COMPARATIVE EXAMPLE 8

On the other hand, an Al₂O₃ heater of this Comparative Example 8 was fabricated through the same process as in Example 25 except that a ceramic substrate and an insulating layer were each formed of an Al₂O₃ sintered body which had the thermal conductivity of 25 W/(m.K) and the three-point bending strength of 31 kg/mm², instead of the ceramic substrate 111 and the insulating layer 113 used in the heater 110 of Example 25 shown in FIG. 13.

COMPARATIVE EXAMPLE 9

Further, an AlN heater of this Comparative Example 9 was fabricated through the same process as in Example 25 except that a ceramic substrate and an insulating layer were each formed of an AlN sintered body which had the thermal conductivity of 140 W/(m.K) and the three-point bending strength of 32 kg/mm², instead of the ceramic substrate 111 and the insulating layer 113 used in the heater 110 of Example 25 shown in FIG. 13.

Figure 17:
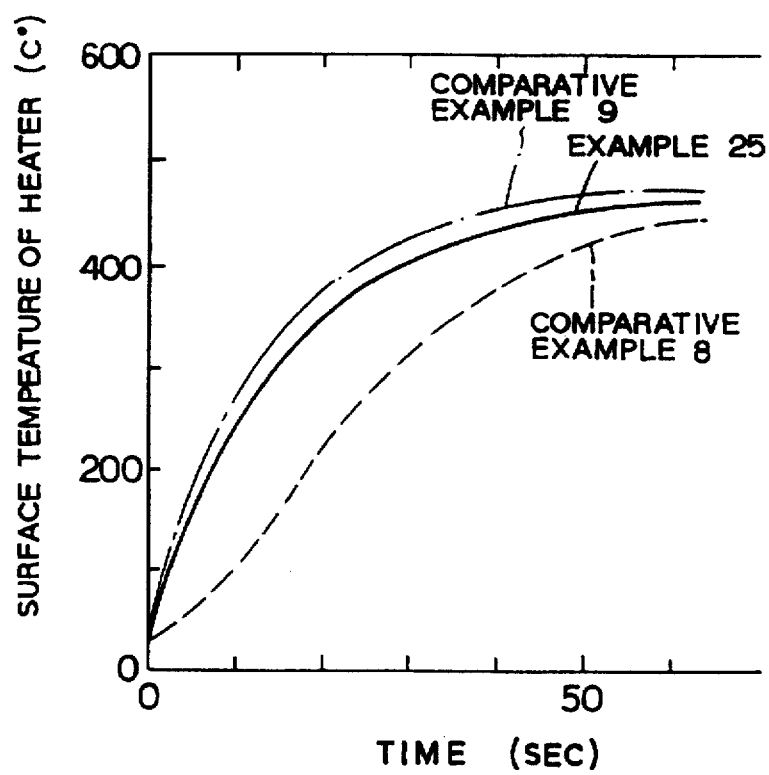
FIG. 17 is a graph showing time-dependent changes in surface temperature of the heaters of Examples and Comparative Examples.

For the heaters of Example 25 and Comparative Examples 8 and 9, the results shown in FIG. 17 were obtained by setting the amount of power supplied to the heating resistor 112 of each heater to 15 W and measuring time-dependent changes in the surface temperature of the heater to evaluate heating-up characteristics (thermal response) of the heaters. Also, the results shown in Table 4 below were obtained by measuring the heating-up rate and the power density as indices for heating abilities of the heaters.
(Table 4)

tive silicon nitride sintered body 107 which has the thermal conductivity 4 to 5 times that of the conventional alumina substrate.

A value of the surface roughness Ra (mean roughness along the center line specified in JIS 0601) greatly affects the adhesion and the chemical bonding strength between the sintered body 107 and the heating resistor 102 disposed

TABLE 4

| | | Sample No. | | |
|---|---|---|---|---|
| Specification | Characteristics | Example 25 | Comparative Example 8 | Comparative Example 9 |
| Cramic Substrate | Kind | High Thermal Conductive $Si_3N_4$ | $Al_2O_3$ | AlN |
| | Thermal Conductivity (W/(m · K)) | 115 | 25 | 140 |
| | Three-Point Bending Strength (kg/mm$^2$) | 98 | 31 | 32 |
| Heating Ability | Heating-up Rate (°C./sec) | 490 | 170 | 580 |
| | Power Density (W/cm$^2$) | 58 | 31 | 61 |

As is apparent from the results shown in FIG. 17 and Table 4, it was confirmed that the heater of Example 25, in which the ceramic substrate and the insulating layer were formed of the silicon nitride sintered body having the high mechanical strength and the high thermal conductivity, provided a quicker rise in the surface temperature immediately after the start of power supply and better thermal response than the heater of Comparative Example 8 in which they were formed of the $Al_2O_3$ sintered body. In FIG. 17, the heater of Example 25 and the heater of Comparative Example 9 being formed of the AlN sintered body exhibit comparable heating-up characteristics because both have the high thermal conductivity. As is apparent from Table 4, however, the heater of Comparative Example 9 has the three-point bending strength about ⅓ time that of the heater of Example 25, and hence the former's durability is extremely inferior to the latter's.

While above Examples are described in connection with the heaters in the form of a flat plate, the heaters are not limited to the flat form, but may be manufactured into any desired shape such as a tubular or annular shape depending on, e.g., the configuration of the object to be heated.

Next, embodiments in which the high thermal conductive silicon nitride sintered body prepared as with any of above Examples is applied to a thermal head will be described with reference to following Example.

EXAMPLE 29

Figure 18:
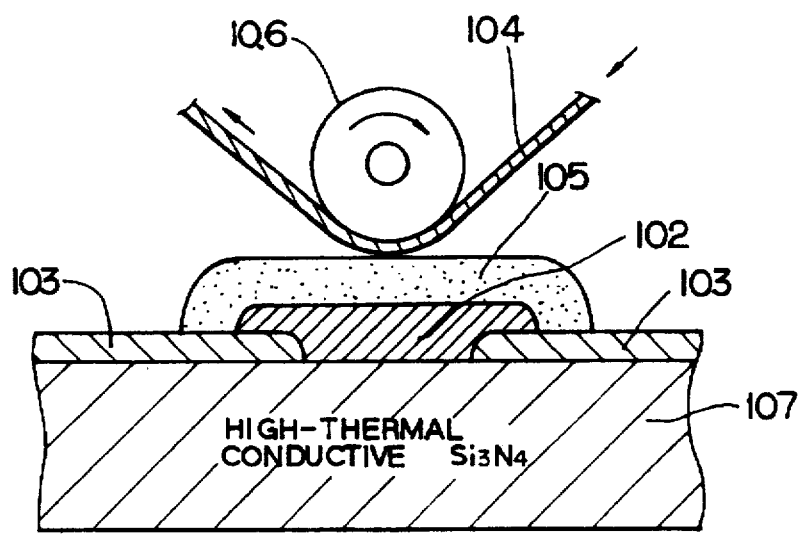
FIG. 18 is a sectional view showing one embodiment of a thick-film type thermal head according to the present invention.
Figure 21:
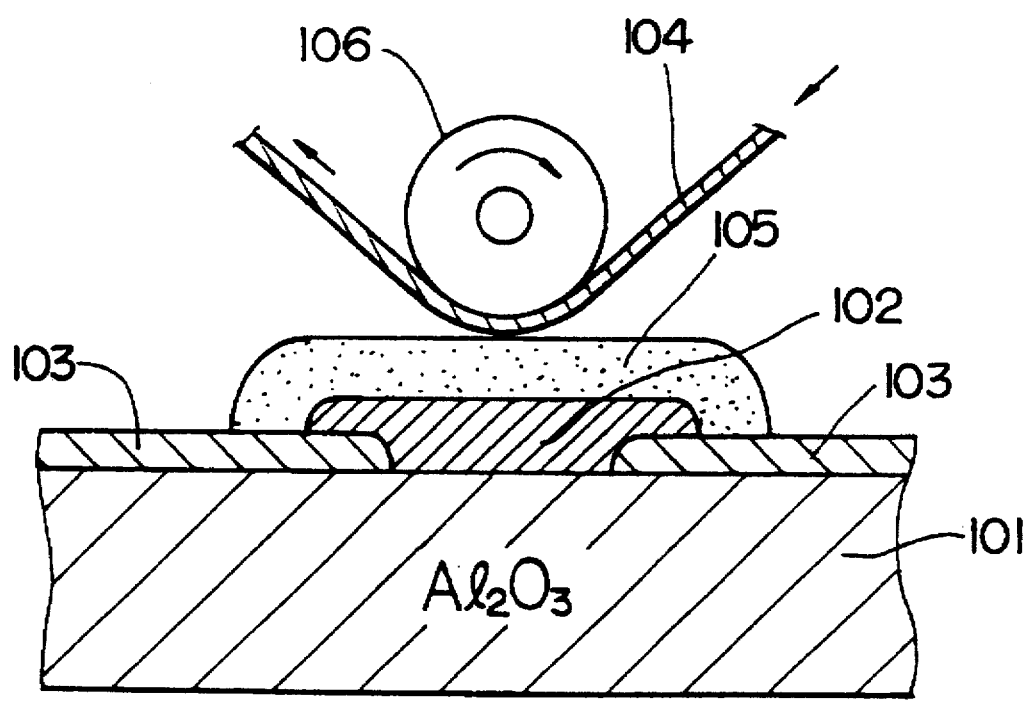
FIG. 21 is a sectional view showing one example of the construction of a conventional thick-film type thermal head.

FIG. 18 is a sectional view showing one embodiment of a thick-film type thermal head according to the present invention. Note that the same components as those in the prior art shown in FIG. 21 are denoted by the same reference numerals and the description of those components will not repeated here.

In the thick-film type thermal head of this Example 29, a heating resistor 102 and a wear-resistant layer 105 are laminated on the surface of a high thermal conductive silicon nitride sintered body 107 which is prepared as with Example 3 and has the surface roughness Ra not greater than 1 μm, the thermal conductivity of 115 W/(m.K) and the three-point bending strength of 98 kg/mm$^2$. Electric leads (electrodes) 103 are formed to be joined to both end portions of the heating resistor 102 by transferring and baking a conductor paste such as Ag, Pd—Ag or Pt—Au.

A main feature of the thermal head of this Example is that its ceramic substrate is formed of the high thermal conducthereon. Therefore, the surface roughness Ra is preferably set to be not greater than 1 μm. If the surface roughness Ra exceeds 1 μm, the adhesion and the bonding strength of the sintered body 107 with respect to the heating resistor 102 and the electric leads 103 would be reduced, resulting in deterioration of reliability and durability of the thermal head.

The high thermal conductive silicon nitride sintered body 107 with the surface roughness Ra being not greater than 1 μm can be prepared by, e.g., grinding the surface of the sintered body into a mirror surface in a usual manner.

The heating resistor 102 generates heat upon application of a pulse voltage between the electric leads (electrodes) 103 and 103, causing a color former in heat-sensitive recording paper to develop a color in the form of dots. The heating resistor is formed by preparing a material, e.g., $Ta_2N$, NiCr alloy, Nesa film, Ta—$SiO_2$ or Ta—Si, into a paste and then coating the paste by the film forming technique such as screen printing.

The wear resistant layer 105 serves to protect the heating resistor 102 against wear caused by contact with the heat-sensitive recording paper, and is formed of materials such as $SiO_2$—$Ta_2O_3$, SiC, $Al_2O_3$ and $SiO_2$.

When a pulse voltage is applied to the heating resistor 102 through the electrodes 103, 103, the heating resistor 102 of the thermal head generates heat, whereupon the color former coated on heat-sensitive recording paper 104, which is pressed by a feed roller 106 against the heating resistor 102 through the wear-resistant layer 105, develops a color in the form of dots. The time during which the pulse voltage is applied is usually on the order of 1 to 10 ms (milli-second).

After disappearance of the pulse voltage, the heat generated by the heating resistor 102 is released to the outside through the high thermal conductive silicon nitride sintered body 107, and the heating resistor 102 is cooled down to a predetermined lower limit of the printing temperature. Then, upon application of the next pulse voltage, the heating and cooling cycles are similarly repeated so that a number of dots develop a color on the moving heat-sensitive recording paper to thereby record an image of letters, symbols or figures depending on an array of the color-developed dots.

Figure 19:
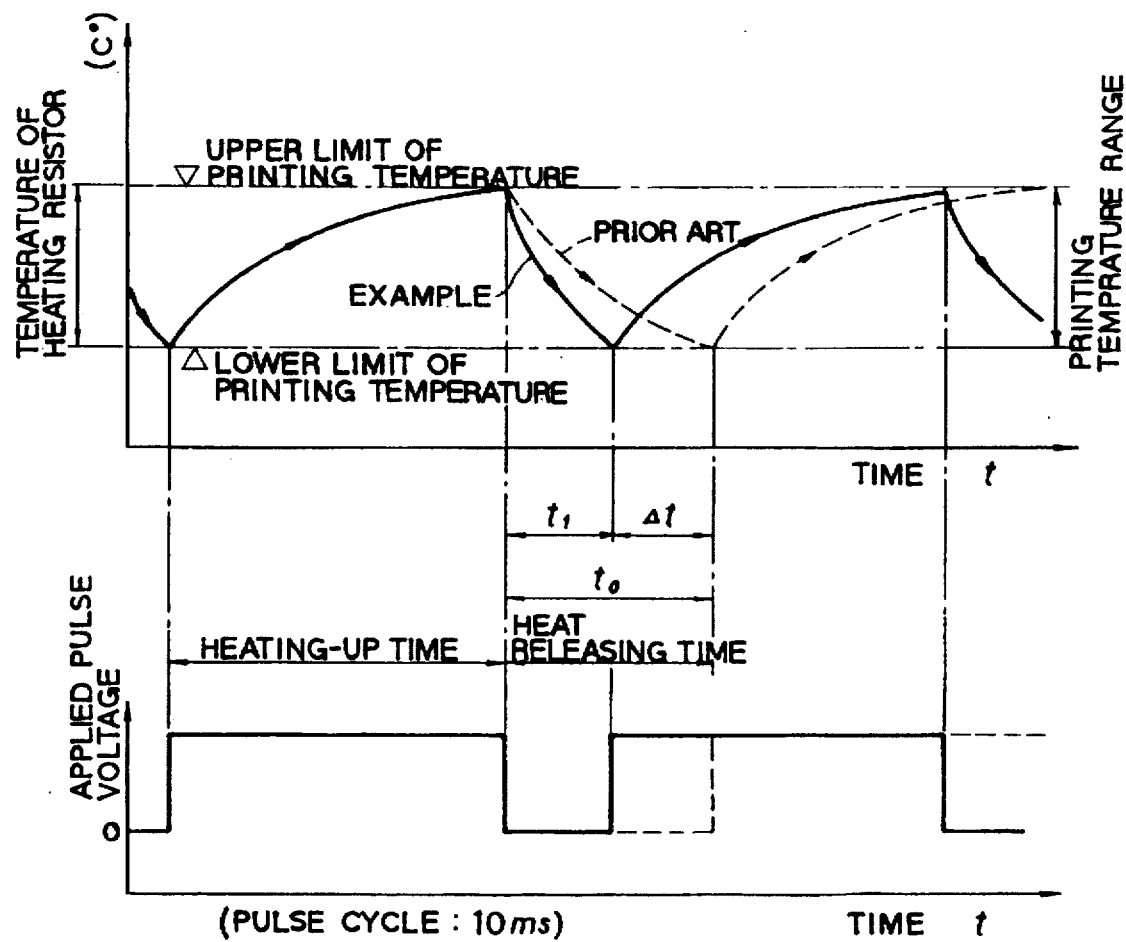
FIG. 19 is a graph showing a thermal response characteristic of the thick-film type thermal head according to the present invention in comparison with the prior art.

A description will now be made of superior characteristics of the thermal head of this Example as compared with the prior art. FIG. 19 is a graph showing time-dependent changes in heating resistor temperature resulted from a printing test in which the thick-film type thermal head of Example 29 using the high thermal conductive silicon nitride sintered body 107 shown in FIG. 18 and the conventional thick-film type thermal head using the $Al_2O_3$ ceramic substrate shown in FIG. 21 were each actually fitted to a printer.

As indicated by the solid line in FIG. 19, since the thermal head of this Example employs the high thermal conductive silicon nitride sintered body 107 as a ceramic substrate, it has a superior characteristic of heat releasing after disappearance of the pulse voltage, and hence the heat releasing time $t_1$ required for the heating resistor to cool down to the predetermined lower limit of the printing temperature is much shorter than the heat releasing time $t_0$ required for the prior art using the ceramic substrate 101 made of $Al_2O_3$.

This means that the printing repetition period given by the sum of the heating-up time and the heat releasing time is reduced, and recording equipment such as printers can be sped up in operation.

A configuration of the heating resistor in the thermal head according to the present invention will now be described. Heretofore, a heating resistor disposed between a pair of electric leads has been formed into a band-like shape such that it has a uniform section at any axial position.

Figure 20:
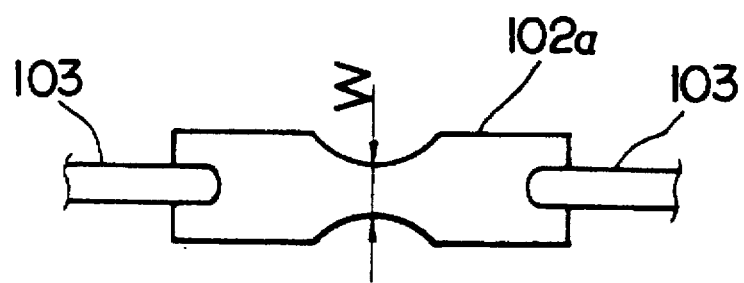
FIG. 20 is a plan view showing an exemplified shape of a heating resistor.

As shown in FIG. 20, however, a heating resistor 102a of the thermal head can also be formed such that its end portions connected to the electrodes 103, 103 are formed into a band-like shape as conventionally, whereas the width W of its central portion is set to be smaller than that of the end portions, thus providing a centrally narrowed configuration as a whole. In this case, the central portion of the heating resistor 102a has a maximum resistance value. When a voltage is applied to the heating resistor 102a through the electrodes 103, 103 to give a current flowing therebetween, only the central portion is first heated to increase temperature so that the temperature reaches a point enough for ink coated on the heat-sensitive recording paper to dissolve and small dots are transferred to the paper surface. With the continued application of the voltage to the heating resistor 102a under the above condition, the region where the temperature reaches the ink dissolving point is gradually enlarged. By thus variably adjusting the energy applied to each heating resistor 102a in accordance with the width of the applied pulse voltage, the size of each transferred dot can be changed depending on the tone of an image. In other words, it is possible to provide gradation in color for each dot and hence to achieve recording by printing with excellent gradation without reducing resolution.

According to the heater and the thermal head of the present invention, as described above, since ceramic substrates, which determine their characteristics of mechanical strength and thermal response, are each formed of the novel high thermal conductive silicon nitride sintered body which has the thermal conductivity not less than 60 W/(m.K), in addition to the high mechanical strength inherently given to a sintered body of silicon nitride, the heater and the thermal head can provide not only superior thermal response for ON-OFF operation of the voltage applied to the heating resistor, but also superior durability. In the thermal head, particularly, since the high thermal conductive silicon nitride sintered body is employed which has the thermal conductivity at least 2 to 5 times that of alumina conventionally used, the falling time required for the heating resistor, once heated up to the printing temperature, to cool down to predetermined temperature is reduced remarkably. Therefore, the repetition period of printing given by the sum of the rising time and the falling time of the heating resistor temperature is shortened to a large extent. As a result, the thermal response of the thermal head can be greatly improved and the recording speed can be greatly increased.

What is claimed is:

1. A semiconductor package comprising a ceramic substrate on which a semiconductor chip is mounted, lead frames joined to the same surface of said ceramic substrate as on which said semiconductor chip is mounted, and bonding wires for electrically connecting said semiconductor chip and said lead frames, wherein said ceramic substrate is formed of a high thermal conductive silicon nitride sintered body which contains a rare earth element in the range of 1.0 to 7.5 wt. % calculated as oxide thereof and Li, Na, K, Fe, Ca, Mg, Sr, Ba, Mn and B as impurity cationic elements in a total amount not greater than 0.3 wt. %, and has the thermal conductivity not less than 60 W/(m.K).

2. A semiconductor package comprising a ceramic substrate on which a semiconductor chip is mounted, lead frames joined to the same surface of said ceramic substrate as on which said semiconductor chip is mounted, and bonding wires for electrically connecting said semiconductor chip and said lead frames, wherein said ceramic substrate is formed of a high thermal conductive silicon nitride sintered body which contains a rare earth element in the range of 1.0 to 7.5 wt. % calculated as oxide thereof and Li, Na, K, Fe, Ca, Mg, Sr, Ba, Mn and B as impurity cationic elements in a total amount not greater than 0.3 wt. %, and has the thermal conductivity not less than 80 W/(m.K).

3. A semiconductor package comprising a ceramic substrate on which a semiconductor chip is mounted, lead frames joined to the same surface of said ceramic substrate as on which said semiconductor chip is mounted, and bonding wires for electrically connecting said semiconductor chip and said lead frames, wherein said ceramic substrate is formed of a high thermal conductive silicon nitride sintered body which consists of silicon nitride particles and a grain boundary phase, a crystal compound phase in said grain boundary phase being not less than 50 vol. % with respect to the entire grain boundary phase, and has the thermal conductivity not less than 80 W/(m.K).

4. A high thermal conductive silicon nitride structural member comprising a rare earth element in the range of 1.0 to 7.5 wt. % calculated as oxide thereof and Li, Na, K, Fe, Ca, Mg, Sr, Ba, Mn and B as impurity cationic elements in a total amount not greater than 0.3 wt. %, and has a thermal conductivity of not less than 60 W/(m.K).

5. A high thermal conductive silicon nitride structural member comprising a rare earth element in the range of 1.0 to 7.5 wt. % calculated as oxide thereof and Li, Na, K, Fe, Ca, Mg, Sr, Ba, Mn and B as impurity cationic elements in a total amount not greater than 0.3 wt. %, and has a thermal conductivity of not less than 80 W/(m.K).

6. A high thermal conductive silicon nitride structural member according to claim 4, wherein said high thermal conductive silicon nitride structural member is a sliding member.

7. A high thermal conductive silicon nitride structural member according to claim 4, wherein said high thermal conductive silicon nitride structural member is a high-temperature corrosion-resistant member.

8. A high thermal conductive silicon nitride structural member according to claim 4, wherein said high thermal conductive silicon nitride structural member is an enclosure.

9. A high thermal conductive silicon nitride structural member which consists of silicon nitride particles and a grain boundary phase, a crystal compound phase in said grain boundary phase being not less than 50 vol. % with respect to the entire grain boundary phase, and has the thermal conductivity not less than 80 W/(m.K).

10. A high thermal conductive silicon nitride structural member according to claim 9, wherein said high thermal conductive silicon nitride structural member is a sliding member.

11. A high thermal conductive silicon nitride structural member according to claim 9, wherein said high thermal conductive silicon nitride structural member is a high-temperature corrosion-resistant member.

12. A high thermal conductive silicon nitride structural member according to claim 9, wherein said high thermal conductive silicon nitride structural member is an enclosure.

13. A heater wherein a heating resistor is disposed in a unitary structure with a high thermal conductive silicon nitride sintered body comprising a rare earth element in the range of 1.0 to 7.5 wt. % calculated as oxide thereof and Li, Na, K, Fe, Ca, Mg, Sr, Ba, Mn and B as impurity cationic elements in a total amount not greater than 0.3 wt. %, and has a thermal conductivity not less than 60 W/(m.K).

14. A heater wherein a heating resistor is disposed in a unitary structure with a high thermal conductive silicon nitride sintered body comprising a rare earth element in the range of 1.0 to 7.5 wt. % calculated as oxide thereof and Li, Na, K, Fe, Ca, Mg, Sr, Ba, Mn and B as impurity cationic elements in a total amount not greater than 0.3 wt. %, and has a thermal conductivity not less than 80 W/(m.K).

15. A heater wherein a heating resistor is disposed in a unitary structure with a high thermal conductive silicon nitride sintered body which consists of silicon nitride particles and a grain boundary phase, a crystal compound phase in said grain boundary phase being not less than 50 vol. % with respect to the entire grain boundary phase, and has the thermal conductivity not less than 80 W/(m.K).

16. A heater comprising a ceramic substrate, a heating resistor disposed on said ceramic substrate, and an insulator layer coated on said ceramic substrate to cover said heating resistor, wherein said insulator layer is formed of a high thermal conductive silicon nitride sintered body which contains a rare earth element in the range of 1.0 to 7.5 wt. % calculated as oxide thereof and Li, Na, K, Fe, Ca, Mg, Sr, Ba, Mn and B as impurity cationic elements in a total amount not greater than 0.3 wt. %, and has the thermal conductivity not less than 60 W/(m.K).

17. A heater comprising a ceramic substrate, a heating resistor disposed on said ceramic substrate, and an insulator layer coated on said ceramic substrate to cover said heating resistor, wherein said insulator layer is formed of a high thermal conductive silicon nitride sintered body which contains a rare earth element in the range of 1.0 to 7.5 wt. % calculated as oxide thereof and Li, Na, K, Fe, Ca, Mg, Sr, Ba, Mn and B as impurity cationic elements in a total amount not greater than 0.3 wt. %, and has the thermal conductivity not less than 80 W/(m.K).

18. A heater comprising a ceramic substrate, a heating resistor disposed on said ceramic substrate, and an insulator layer coated on said ceramic substrate to cover said heating resistor, wherein said insulator layer is formed of a high thermal conductive silicon nitride sintered body which consists of silicon nitride particles and a grain boundary phase, a crystal compound phase in said grain boundary phase being not less than 20 vol. % with respect to the entire grain boundary phase, and has the thermal conductivity not less than 60 W/(m.K).

19. A heater comprising a ceramic substrate, a heating resistor disposed on said ceramic substrate, and an insulator layer coated on said ceramic substrate to cover said heating resistor, wherein said insulator layer is formed of a high thermal conductive silicon nitride sintered body which consists of silicon nitride particles and a grain boundary phase, a crystal compound phase in said grain boundary phase being not less than 50 vol. % with respect to the entire grain boundary phase, and has the thermal conductivity not less than 80 W/(m.K).

20. A thermal head wherein a heating resistor and a wear-resistant layer are laminated in a unitary structure on the surface of a high thermal conductive silicon nitride sintered body comprising a rare earth element in the range of 1.0 to 7.5 wt. % calculated as oxide thereof and Li, Na, K, Fe, Ca, Mg, Sr, Ba, Mn and B as impurity cationic elements in a total amount not greater than 0.3 wt. %, and has a thermal conductivity of not less than 60 W/(m.K).

21. A thermal head according to claim 20, wherein said heating resistor is made of at least one element or compound selected from the group consisting of Ti, Zr, Hf, V, Cr, Mo, W, NiCr, Nesa film, Ta—Si, $Ta_2N$, Ta—$SiO_2$ and Nb—$SiO_2$.

22. A thermal head according to claim 20, wherein said heating resistor is connected at both ends to respective electrodes, both end portions of said heating resistor connected to said electrodes are each formed into a stripe shape, and the width of a central portion of said heating resistor is set to be smaller than the width of said both end portions.

23. A thermal head wherein a heating resistor and a wear-resistant layer are laminated in a unitary structure on the surface of a high thermal conductive silicon nitride sintered body which consists of silicon nitride particles and a grain boundary phase, a crystal compound phase in said grain boundary phase being not less than 20 vol. % with respect to the entire grain boundary phase, and has the thermal conductivity not less than 60 W/(m.K).

24. A thermal head according to claim 23, wherein said heating resistor is made of at least one element or compound selected from the group consisting of Ti, Zr, Hf, V, Cr, Mo, W, NiCr, Nesa film, Ta—Si, $Ta_2N$, Ta—$SiO_2$ and Nb—$SiO_2$.

25. A thermal head according to claim 23, wherein said heating resistor is connected at both ends to respective electrodes, both end portions of said heating resistor connected to said electrodes are each formed into a stripe shape, and the width of a central portion of said heating resistor is set to be smaller than the width of said both end portions.

* * * * *